United States Patent
McNulty et al.

(10) Patent No.: US 10,877,081 B2
(45) Date of Patent: Dec. 29, 2020

(54) SYSTEM AND METHOD FOR VOLTAGE DETECTION FOR EQUIPMENT

(71) Applicant: Greenlee Tools, Inc., Rockford, IL (US)

(72) Inventors: William J. McNulty, Washington, DC (US); Michael Z. Standiford, Libertyville, IL (US); Ryan Berg, Hixson, TN (US); Eli Alexander Johnson, Ooltewah, TN (US)

(73) Assignee: GREENLEE TOOLS, INC., Rockford, IL (US)

( * ) Notice: Subject to any disclaimer, the term of this patent is extended or adjusted under 35 U.S.C. 154(b) by 61 days.

(21) Appl. No.: 15/963,294

(22) Filed: Apr. 26, 2018

(65) Prior Publication Data
US 2018/0313882 A1    Nov. 1, 2018

Related U.S. Application Data

(63) Continuation-in-part of application No. 15/581,780, filed on Apr. 28, 2017.
(Continued)

(51) Int. Cl.
*G01R 29/12* (2006.01)
*G01R 19/165* (2006.01)
(Continued)

(52) U.S. Cl.
CPC .......... *G01R 29/12* (2013.01); *G01R 19/165* (2013.01); *G01R 29/0857* (2013.01); *H02H 1/0007* (2013.01); *H02H 3/20* (2013.01)

(58) Field of Classification Search
CPC ........ G08B 21/18; G08B 21/182; G08B 7/06; G08B 5/00; G08B 5/223; H02H 7/20;
(Continued)

(56) References Cited

U.S. PATENT DOCUMENTS

| 4,714,915 A | 12/1987 | Hascal et al. |
|---|---|---|
| 5,001,455 A | 3/1991 | Starchevich |

(Continued)

FOREIGN PATENT DOCUMENTS

| EP | 1296150 | 3/2003 |
|---|---|---|
| EP | 2746784 | 8/2016 |

(Continued)

OTHER PUBLICATIONS

"Choose your RF Module," RF Modules / Synapse Wireless, http://www.synapse-wireless.com/iot-products/core-iot/rf-modules/, Nov. 23, 2015, 2 pages.
(Continued)

*Primary Examiner* — Huy Q Phan
*Assistant Examiner* — David B Frederiksen
(74) *Attorney, Agent, or Firm* — Klintworth & Rozenblat IP LLP

(57) ABSTRACT

A system and method used to detect voltage by an electric field detector on equipment is provided. The equipment includes a component which is configured to come into direct contact with, or come into proximity of, a conductor of electricity, and a control system which is in operative communication with the component. An electric field detector is provided on the equipment. The detector includes field detection circuitry configured to detect a voltage in an electric field in the environment which meets or exceeds a voltage threshold. When an overvoltage is detected by the electric field detector, the control system of the equipment is configured to act by performing one of 1) activating a warning module on the equipment and 2) causing the component of the equipment to act.

16 Claims, 22 Drawing Sheets

Related U.S. Application Data

(60) Provisional application No. 62/491,697, filed on Apr. 28, 2017, provisional application No. 62/659,510, filed on Apr. 18, 2018.

(51) Int. Cl.
*H02H 1/00* (2006.01)
*H02H 3/20* (2006.01)
*G01R 29/08* (2006.01)

(58) Field of Classification Search
CPC .............. G01R 29/08; G01R 29/0807; G01R 29/0814; G01R 29/085; G01R 29/0857
See application file for complete search history.

(56) References Cited

U.S. PATENT DOCUMENTS

| | | | |
|---|---|---|---|
| 5,814,968 A | 9/1998 | Lovegreen et al. | |
| 6,170,607 B1 | 1/2001 | Freeman et al. | |
| 6,329,924 B1 | 12/2001 | McNulty | |
| 6,677,743 B1 | 1/2004 | Coolidge et al. | |
| 6,788,215 B1* | 9/2004 | White | G08B 21/02 340/657 |
| 6,998,832 B1 | 2/2006 | McNulty | |
| D577,300 S | 9/2008 | Radecke et al. | |
| D622,956 S | 9/2010 | Hoffman | |
| D650,116 S | 12/2011 | Buyce et al. | |
| 8,786,447 B1* | 7/2014 | Wise | G01R 29/0857 340/573.4 |
| 9,116,178 B1 | 8/2015 | Czarnecki | |
| 9,215,394 B2 | 12/2015 | Barnett et al. | |
| 9,265,331 B1 | 2/2016 | Hoffman | |
| 2004/0080320 A1* | 4/2004 | Golub | G04G 21/02 324/457 |
| 2005/0040809 A1* | 2/2005 | Uber, III | G01R 15/142 324/117 R |
| 2005/0264427 A1 | 12/2005 | Zeng et al. | |
| 2006/0186872 A1 | 8/2006 | Trethewey | |
| 2006/0192545 A1 | 8/2006 | Karagiannis | |
| 2007/0018841 A1 | 1/2007 | Nickerson | |
| 2007/0236358 A1* | 10/2007 | Street | G08B 1/08 340/628 |
| 2009/0108840 A1 | 4/2009 | Givens | |
| 2010/0052929 A1* | 3/2010 | Jackett | G01R 29/085 340/660 |
| 2013/0010110 A1* | 1/2013 | Kalokitis | G01R 29/0871 348/143 |
| 2014/0184425 A1 | 7/2014 | Smith et al. | |
| 2015/0091735 A1* | 4/2015 | McNulty | A61B 5/0006 340/660 |
| 2010/5323580 | 11/2015 | Olson et al. | |
| 2015/0323580 A1* | 11/2015 | Olson | G01V 3/10 324/207.22 |
| 2016/0209445 A1 | 7/2016 | McCammon et al. | |
| 2017/0045571 A1* | 2/2017 | Joseph | G01R 31/085 |
| 2017/0205454 A1 | 7/2017 | Rachakonda et al. | |
| 2018/0336776 A1* | 11/2018 | Liu | G01J 1/0271 |

FOREIGN PATENT DOCUMENTS

| | | |
|---|---|---|
| EP | 3124983 | 2/2017 |
| WO | 99/13698 | 3/1999 |
| WO | 2016/014260 | 1/2016 |

OTHER PUBLICATIONS

"Hi Volt Alert System," Atlas Polar Company Ltd., Toronto, ON, Canada, http://http://www.atlaspolar.com/media/material-handling-equipment/hivolt-alert/brochures/HiVolt-Alert-Equipment.pdf, Aug. 4, 2016, 2 pages.

"HVPS-110-W Wireless High Voltage Proximity Alarm," Semrad pty Ltd., Engadine New South Wale, Australia, http://www.semrad.com.au/pdf/safe_systems/Sigalarm_Wireless_High_Voltage_Proximity_Alarm.pdf, Mar. 21, 2015, 4 pages.

"SNAP Engine SM220 Series," Digi-Key Part No. 746-1053-1-ND, Catalog No. SM220UF1 synapse Wireless / RF/IF and RFID /DigiKey, http://www.digikey.com/product-detail/en/synapse-wirelessSM220Uf1/746-1053-1-ND/5 . . ., 1995-2016, 2 pages.

Design U.S. Appl. No. 29/563,315, filed May 4, 2016.

Extended European Search Report from corresponding European Application No. 18169718.6 dated Oct. 5, 2018, 7 pages.

Office Action for European patent application No. 18166715.5, dated Aug. 8, 2019, 5 pages.

Extended European Search Report for European patent application No. 18166715.5, dated Aug. 30, 2018, 7 pages.

Office Action for U.S. Appl. No. 15/581,780 dated Sep. 23 2019, 14 pages.

Brochure: "Sound Permeable Waterproof Film," Seiren Co., LTD., Osaka, Japan, www.seiren.com/seiren, 2014, 1 page.

Webpage: "Personal Voltage Detector," HD Electric Co., Waukegan, IL, USA, http://www.hdelectriccompany.com/hd-electric-products/etm/personal-voltage-detectors/v-watch.htm, 2001, 3 pages.

Webpage: "P796 Mini Tube Cord Lock 1/8 Inch," Best Buy Button & Buckle, http://cord-lock.com/p796-mini-tube-cord-lock.aspx, 2009, 2 pages.

Webpage: "V-Watch Personal Voltage Detectors," HD Electric Co., Waukegan, IL, USA, http://www.hdelectriccompany.com/assets/files/V-Watch%20Personal%20Personal%20Voltage%20Detectors%20Literature.pdf, 2015, 2 pages.

Machine translation of EP 3124983 A1.

Final Office Action from U.S. Appl. No. 15/581,780 dated Mar. 19, 2020, 27 pages.

Notice of Allowance for U.S. Appl. No. 15/581,780 dated Sep. 17, 2020, 9 pages.

\* cited by examiner

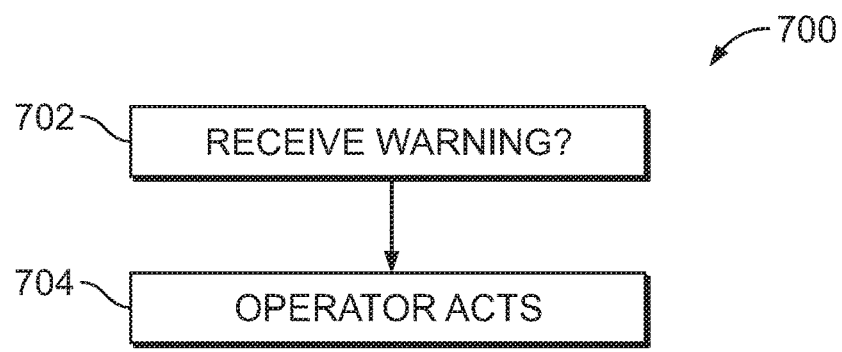
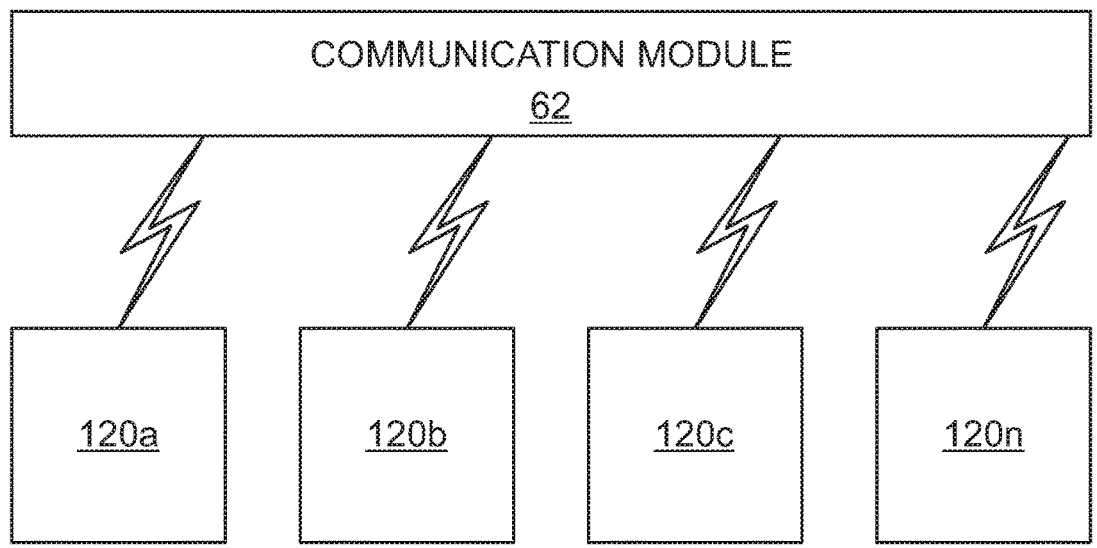
FIG. 9
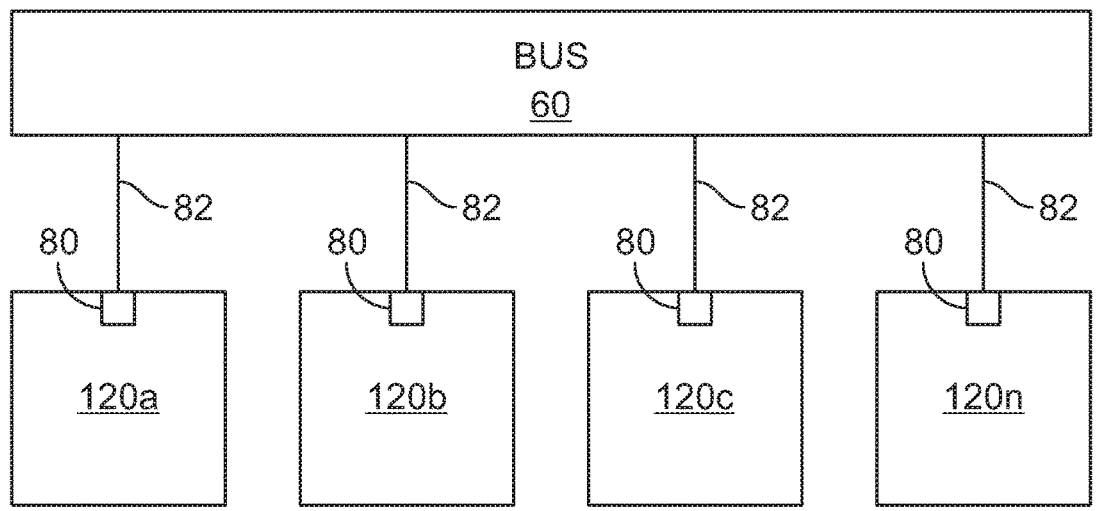
FIG. 10

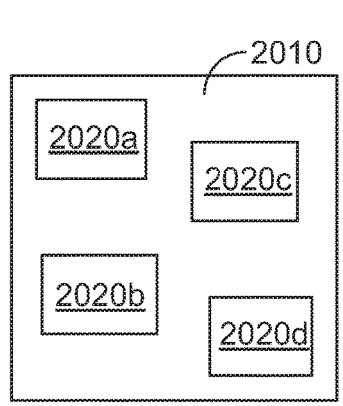
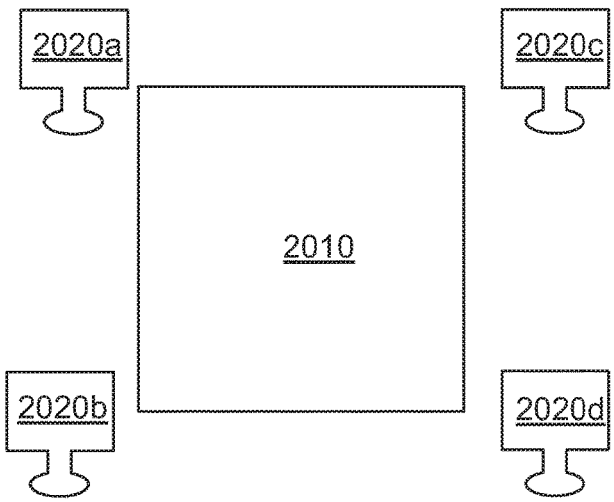
FIG. 23A    FIG. 23B
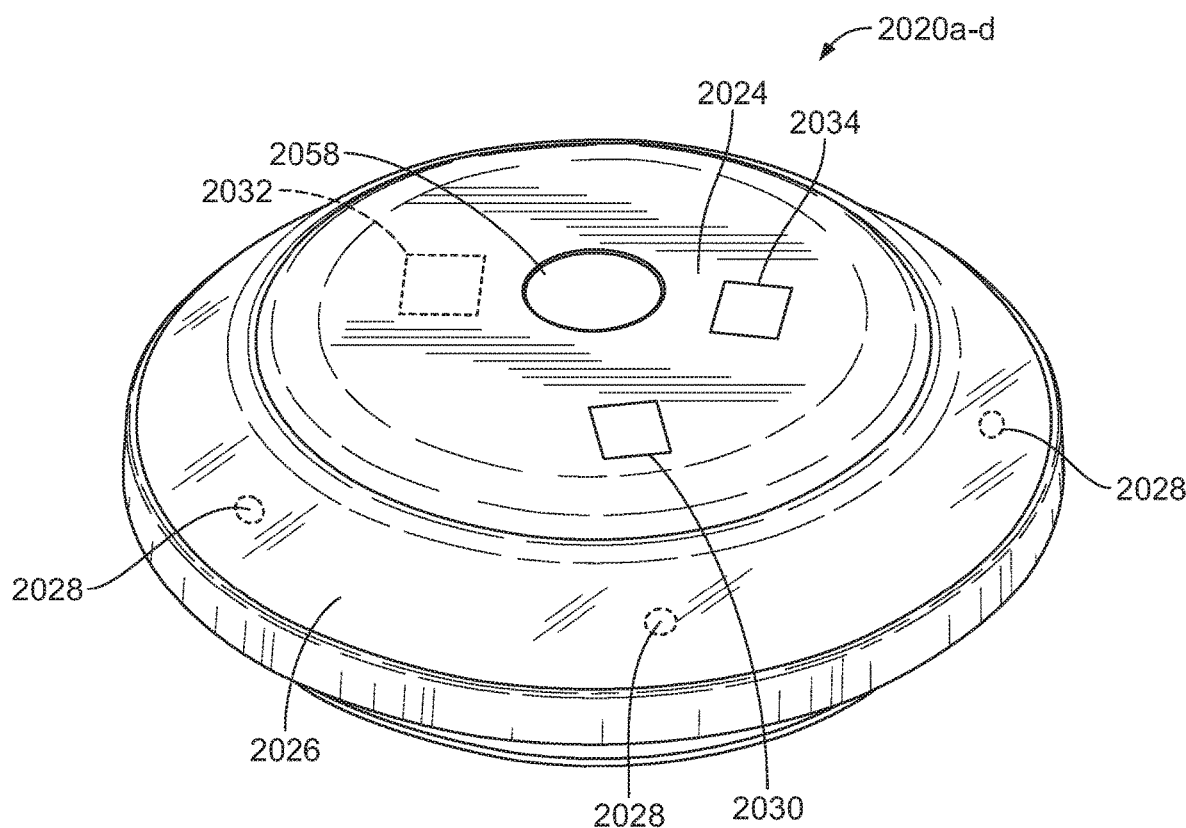
FIG. 24

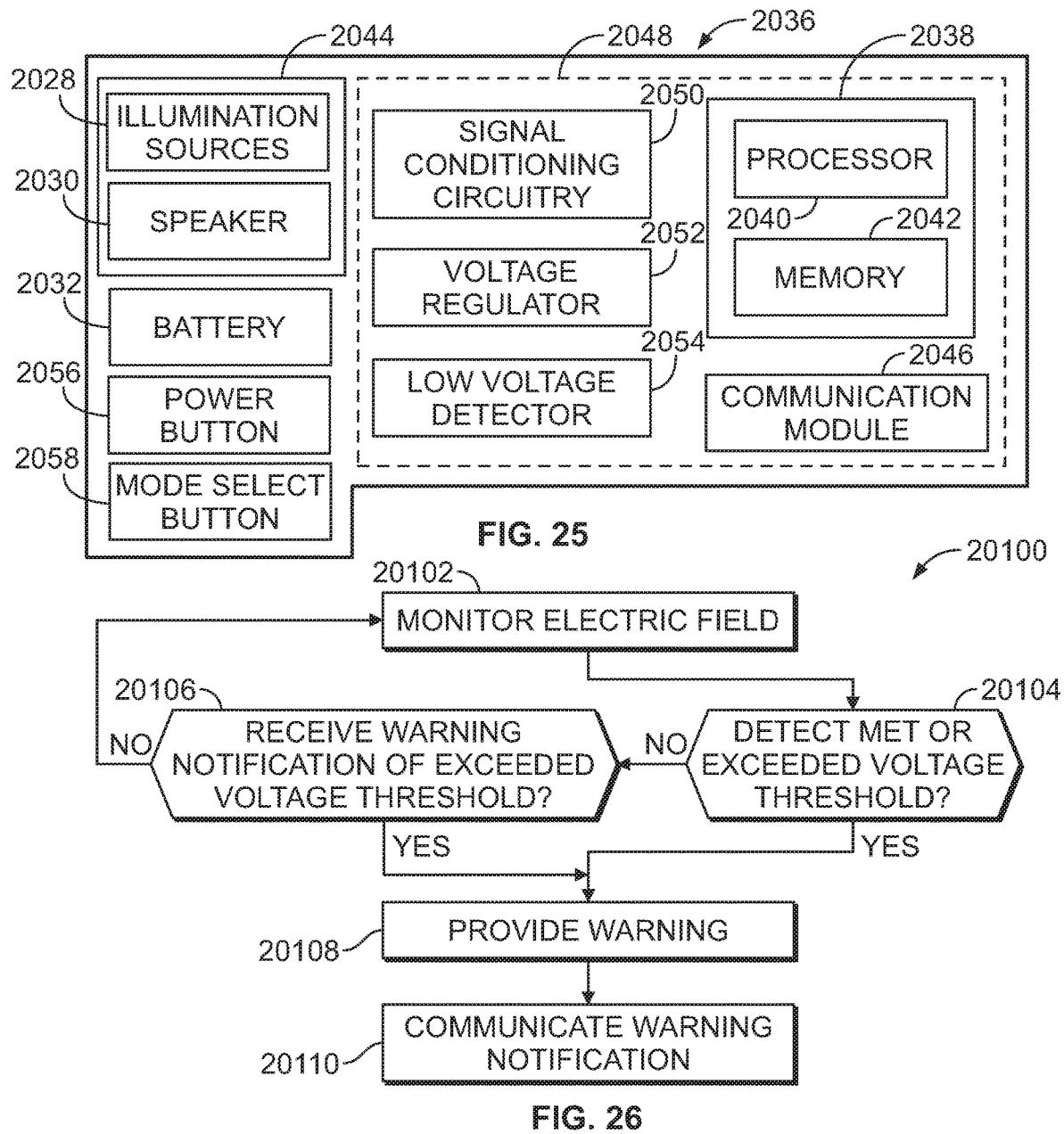
FIG. 25
FIG. 26
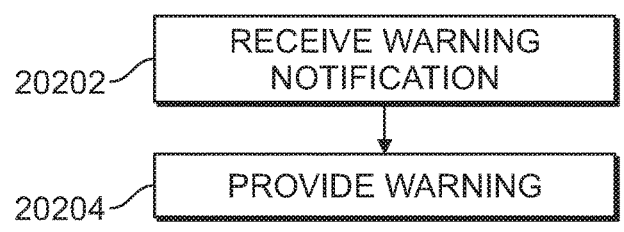
FIG. 27

SYSTEM AND METHOD FOR VOLTAGE DETECTION FOR EQUIPMENT

This application is a continuation-in-part application of U.S. Ser. No. 15/581,780, filed on Apr. 28, 2017. This application claims the domestic benefit of U.S. Provisional Application Ser. No. 62/491,697 filed on Apr. 28, 2017 and U.S. Provisional Application Ser. No. 62/659,510 filed on Apr. 18, 2018.

FIELD OF THE DISCLOSURE

The present disclosure generally relates a system and method used to detect voltage by an electric field detector on equipment.

BACKGROUND

Reliably detecting high voltage on distribution and transmission voltage power lines around equipment is critical to the jobs performed by the operators of such equipment. These jobs are performed more quickly and safely when the voltage detection is also convenient and easy to use.

SUMMARY

In an embodiment, a system and method used to detect voltage by an electric field detector on equipment is provided. The equipment includes a component which is configured to come into direct contact with, or come into proximity of, a conductor of electricity, and a control system which is in operative communication with the component. An electric field detector is provided on the equipment. The detector includes field detection circuitry configured to detect a voltage in an electric field in the environment which meets or exceeds a voltage threshold. When an overvoltage is detected by the electric field detector, the control system of the equipment is configured to act by performing one of 1) activating a warning module on the equipment and 2) causing the component of the equipment to act.

This Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages of various disclosed embodiments will become apparent from the following detailed description taken in conjunction with the accompanying drawings, which illustrate, by way of example, the principles of the described embodiments.

BRIEF DESCRIPTION OF THE DRAWINGS

The organization and manner of the structure and operation of the disclosed embodiments, together with further objects and advantages thereof, may best be understood by reference to the following description, taken in connection with the accompanying drawings, which are not necessarily drawn to scale, wherein like reference numerals identify like elements in which:

FIGS. 4-6 are flowcharts of example logic of the control apparatus;

FIGS. 7 and 8 are flowcharts of example logic of the control system;

FIGS. 9 and 10 are block diagrams of communication apparatus;

FIGS. 23A and 23B are example environments for positioning a system of electric field detectors;

FIG. 24 is a perspective view of an example electric field detector of FIGS. 23A and 23B;

FIG. 25 is a block diagram of example control apparatus of the electric field detector of FIGS. 23A and 23B;

FIG. 26 is a flowchart of an example logic of the electric field detector of FIGS. 23A and 23B;

FIG. 27 is a flowchart of an example logic of the system using the electric field detector of FIGS. 23A and 23B;

DETAILED DESCRIPTION OF THE ILLUSTRATED EMBODIMENTS

Figure 1A:
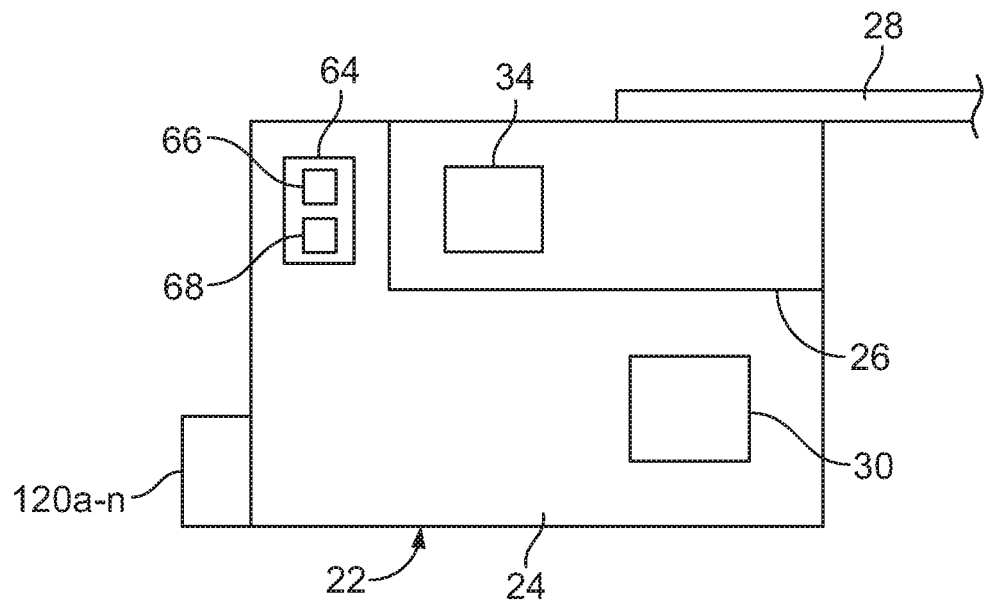
FIGS. 1A and 1B are schematic view of a piece of equipment and a conductor of electricity.
Figure 1B:
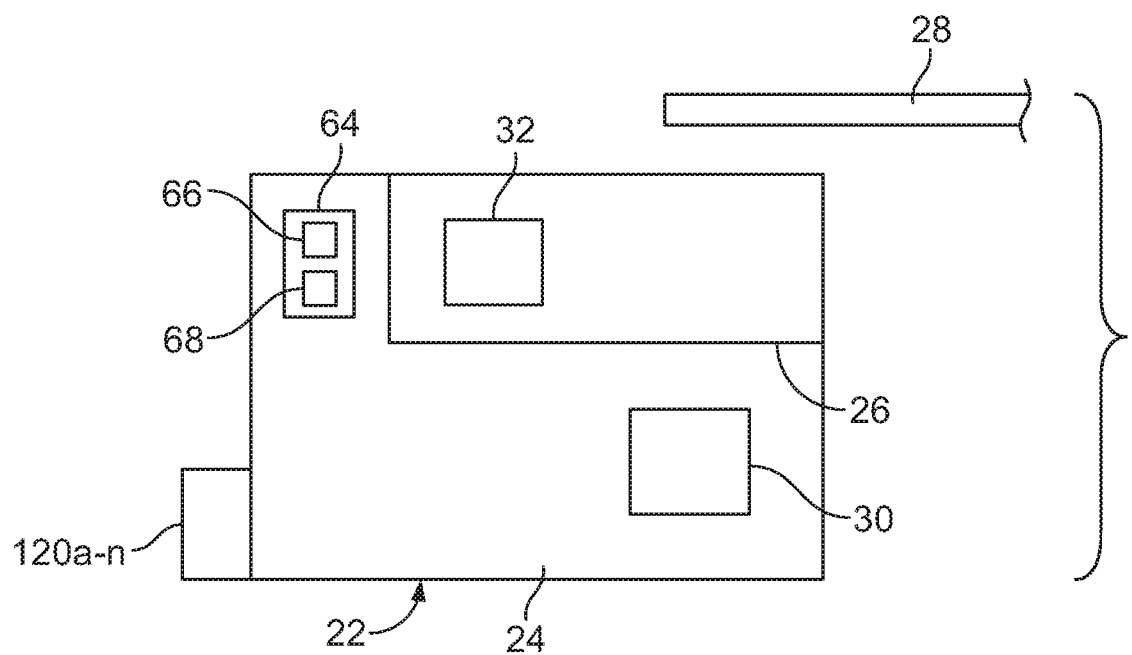

While the disclosure may be susceptible to embodiment in different forms, there is shown in the drawings, and herein will be described in detail, a specific embodiment with the understanding that the present disclosure is to be considered an exemplification of the principles of the disclosure, and is not intended to limit the disclosure to that as illustrated and described herein. Therefore, unless otherwise noted, features disclosed herein may be combined together to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure.

In an embodiment as shown in FIGS. 1-22, the present disclosure relates to voltage detection by an electric field detector 120a-n provided on a piece of equipment 22, and more particularly relates to detecting the presence of voltage that meets or exceeds one or more voltage thresholds (herein defined as an "overvoltage") in a vicinity around the equipment 22. In an embodiment, the present disclosure relates to voltage detection by an electric field detector 120a-n provided on a piece of equipment 22, and more particularly relates to detecting the presence of voltage that meets or exceeds a voltage threshold (herein defined as an "overvoltage") in a vicinity around the equipment 22. In response to the detection of the overvoltage, action is taken.

In an embodiment, the electric field detector 120a-n on the equipment 22 is configured to provide a warning, for example, a visual and/or audio warnings, to operators of the presence of the overvoltage. In an embodiment, the equipment 22 is configured to receive a warning notification from the electric field detector 120a-n and provide a warning, for example, a visual and/or audio warnings, of the presence of the overvoltage to an operator(s) of the equipment 22. In some embodiments, the equipment 22 is configured to receive a warning notification from the electric field detector 120a-n and in response, act. In some embodiments, the operator receives a warning and in response, acts. In an embodiment, multiple electric field detectors 120a-n are provided on the equipment 22. As used herein, the term "operator" or "operators" means a person or persons proximate to, or within, the equipment 22. In an embodiment, the voltage threshold is 236 Volts or greater, e.g., at 50 Hz/60 Hz. In some embodiments, the electric field detectors 120a-n detect alternating current (AC) voltage. In an embodiment, at least one or more of the electric field detectors 120a-n is placed in clear view of the operators working in or around the equipment 22.

In an embodiment, the equipment 22 includes a body 24 which has components 26 that come into direct contact with a conductor 28 of electricity or come into proximity of a conductor 28 of electricity. The equipment 22 has a control system 30 which is in operative communication with the components 26 and configured to control operation of the components 26. In an embodiment, the components 26 includes a motor 32 which activates other components 26 of the equipment 22 to cause the equipment 22 to perform a function. The motor 32 may, for example, include an electric motor, internal combustion engine, hydraulic motor, some combination thereof, or the like that is suitable to supply motive power to the equipment 22 and/or one or more moving components thereof. In an embodiment, the equipment 22 has wheels. In an embodiment, the equipment 22 is mounted on the ground.

Figure 2:
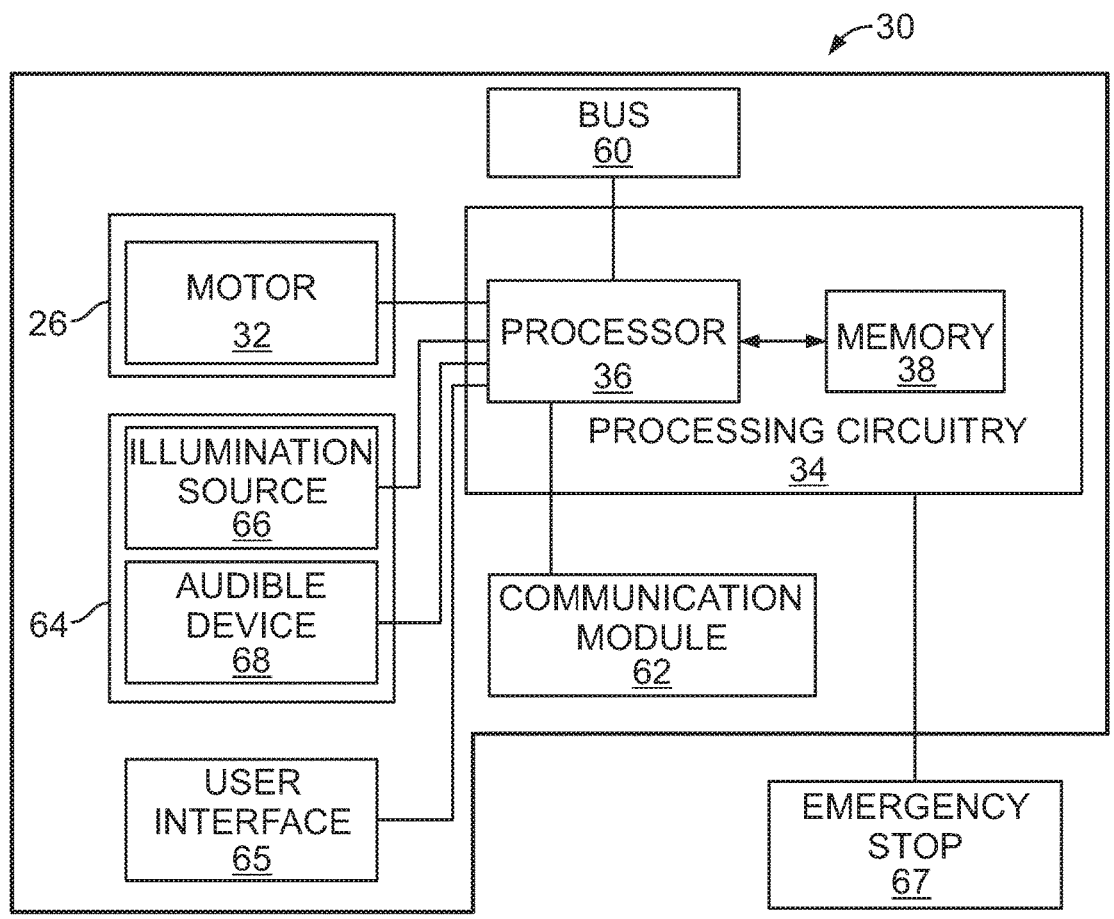
FIG. 2 is a block diagram of a control system of the piece of equipment.

Attention is invited to FIG. 2 which illustrates a block diagram of a control system 30 of the equipment 22 in accordance with some example embodiments. It will be appreciated that the components, devices or elements illustrated in and described with respect to FIG. 2 below may not be mandatory and thus some may be omitted in certain embodiments. Additionally, some embodiments may include further or different components, devices or elements beyond those illustrated in and described with respect to FIG. 2.

In an embodiment, the control system 30 of the equipment 22 includes processing circuitry 34 that is configurable to perform actions in accordance with one or more example embodiments disclosed herein. The processing circuitry 34 may be configured to perform data processing, application execution and/or other processing and management services according to one or more example embodiments.

The processing circuitry 34 includes a processor 36 and, in some embodiments, may further include memory 38. In this regard, the processing circuitry 34 may be configured to perform and/or control performance of the components 26 in accordance with various example embodiments. It will be appreciated that the components, devices or elements illustrated in and described with respect to FIG. 2 may not be mandatory and thus some may be omitted in certain embodiments. Additionally, some embodiments may include further or different components, devices or elements beyond those illustrated in and described with respect to FIG. 2.

In some embodiments, the control system 30 or a portion (s) or component(s) thereof, such as the processing circuitry 34, may include one or more chipsets and/or other components that may be provided by integrated circuits.

The processor 36 may be embodied in a variety of forms. For example, the processor 36 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 36 may comprise a plurality of processors. The plurality of processors may be in operative communication with each other and may be collectively configured to perform one or more functionalities of the control system 30 as described herein. For example, in some embodiments in which the processor 36 comprises a plurality of processors, the plurality of processors may comprise one or more on-board controllers, such as may be implemented on the activator of some embodiments. In some example embodiments, the processor 36 may be configured to execute instructions that may be stored in the memory 38 or that may be otherwise accessible to the processor 36. Depending on the form of instructions that may be stored in the memory 38 or otherwise accessed by the processor 36, such execution of instructions may, for example, include execution of compiled executable code, translation or interpretation of stored program instructions, some combination thereof, or other method through which the processor 36 may read and execute computer program instructions. As such, whether configured by hardware or by a combination of hardware and software, the processor 36 is capable of performing operations according to various embodiments while configured accordingly.

In some example embodiments, the memory 38 may include one or more memory devices. Memory 38 may include fixed and/or removable memory devices. In some embodiments, the memory 38 may provide a non-transitory computer-readable storage medium that may store computer program instructions that may be executed by the processor 36. In this regard, the memory 38 may be configured to store information, data, applications, instructions and/or the like for enabling the control system 30 to carry out various functions in accordance with one or more example embodiments.

Each electric field detector 120a-n includes a control apparatus 140. Attention is invited to FIG. 3 which illustrates a block diagram of a control apparatus 140 that may be implemented on each electric field detector 120a-n in accordance with some example embodiments. It will be appreciated that the components, devices or elements illustrated in and described with respect to FIG. 3 below may not be mandatory and thus some may be omitted in certain embodiments. Additionally, some embodiments may include further or different components, devices or elements beyond those illustrated in and described with respect to FIG. 3.

The control apparatus 140 of each electric field detector 120a-n includes field detection circuitry 142 which is configured to detect voltage in the electric field in the area around the electric field detector 120a-n and to determine whether the detected voltage meets or exceeds the voltage threshold, and in response to the detection by the field detection circuitry 142 of an overvoltage, is configurable to perform actions in accordance with one or more example embodiments disclosed herein. An example field detection circuitry 142 is manufactured by HD ELECTRIC COMPANY™, for example, as used in the WATCHMAN™ work area voltage detector, part number WM-01.

Figure 3:
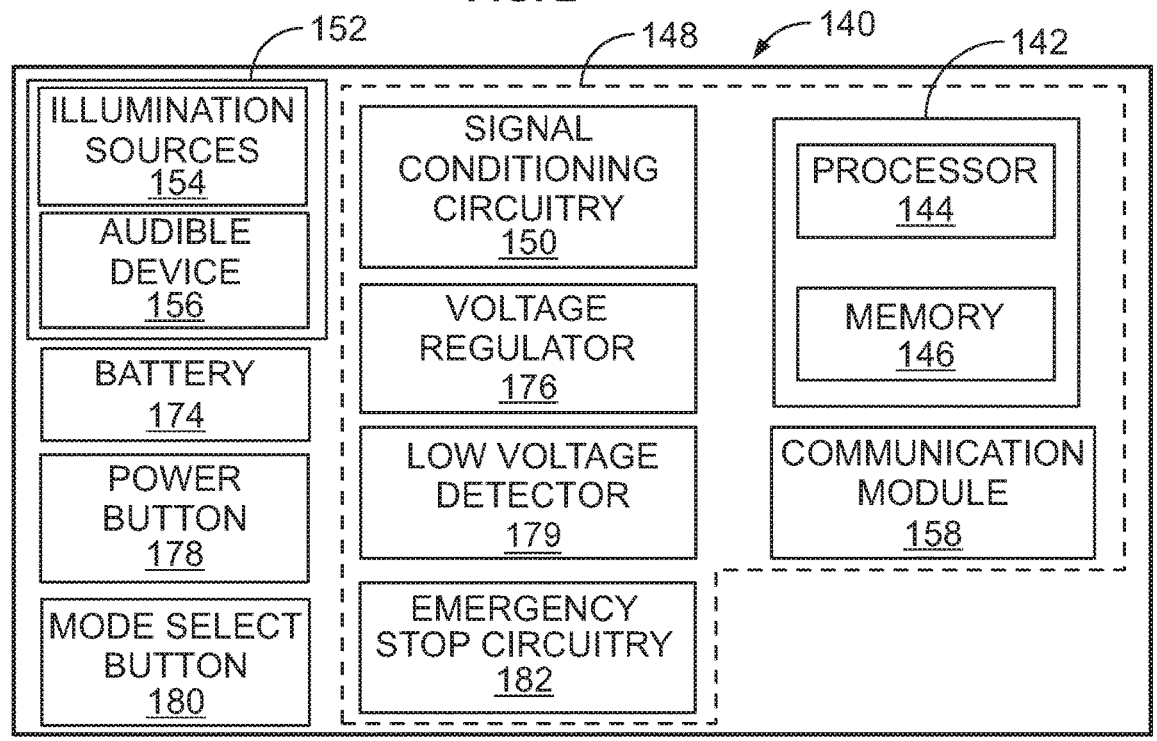
FIG. 3 is a block diagram of a control apparatus of an electric field detector of the piece of equipment.

The field detection circuitry 142 may include a processor 144 and, in some embodiments, such as that illustrated in FIG. 3 may further include memory 146. The field detection circuitry 142 may be configured to perform data processing, application execution and/or other processing and management services according to one or more example embodiments.

The processor 144 may be embodied in a variety of forms. For example, the processor 144 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 144 may comprise a plurality of processors. The plurality of processors may be in operative communication with each other and may be collectively configured to perform one or more functionalities of the control apparatus 140 as described herein. In some example embodiments, the processor 144 may be configured to execute instructions that may be stored in the memory 146 or that may be otherwise accessible to the processor 144. Depending on the form of instructions that may be stored in the memory 146 or otherwise accessed by the processor 144, such execution of instructions may, for example, include execution of compiled executable code, translation or interpretation of stored program instructions, some combination thereof, or other method through which the processor 144 may read and execute computer program instructions. As such, whether configured by hardware or by a combination of hardware and software, the processor 144 is capable of performing operations according to various embodiments while configured accordingly.

The memory 146 can include one or more of a program memory, a cache, random access memory (RAM), a read only memory (ROM), a flash memory, a hard drive, etc., and/or other types of memory. In some example embodiments, the memory 146 may include one or more memory devices. Memory 146 may include fixed and/or removable memory devices. In some embodiments, the memory 146 may provide a non-transitory computer-readable storage medium that may store computer program instructions that may be executed by the processor 144. In some embodiments, the memory 146 may be configured to store information, data, applications, instructions (e.g., compiled executable program instructions, uncompiled program code, some combination thereof, or the like) and/or the like for enabling the control apparatus 140 to carry out various functions in accordance with one or more example embodiments. In some embodiments, the memory 146 may be in operative communication with the processor 144 via one or more buses for passing information among components of the control apparatus 140.

In some embodiments, some of the control apparatus 140 can reside on a printed circuit board assembly (PCBA) 148, or other type of electrical component assembly, e.g., a 3D printer process assembly. It will be appreciated that where PCBA 148 is described, it is described by way of non-limiting example, such that alternative assemblies on which circuitry and/or other electronic components may be embodied may be substituted for PCBA 148 within the scope of the disclosure, including but not limited to variously configured point-to-point constructed circuits, application-specific integrated circuit (ASIC), field programmable gate array (FPGA), etc. In some embodiments, the field detection circuitry 142 is located on the PCBA 148. Additional or fewer components may be included on the PCBA 148 depending on an implementation.

Signal conditioning circuitry 150 can turn signals into digital signals before being received by the field detection circuitry 142. Additionally, or alternatively, the control apparatus 140 may include an onboard analog-to-digital converter and/or other circuitry that may be configured to convert analog signals into digital signals, e.g., for processing.

In some embodiments, the control apparatus 140 or a portion(s) or component(s) thereof, such as the field detection circuitry 142, may include one or more chipsets and/or other components that may be provided by integrated circuits.

In some embodiments, the control apparatus 140 includes a warning module 152 in operative communication with the processor 144, and which includes one or more illumination sources 154 (to provide a visual warning to the operator) and/or one or more audible devices 156 (to provide an audio warning to the operator). Non-limiting examples of an illumination source 154 includes, but is not limited to, light emitting diodes (LEDs), incandescent bulbs, gas-based lamps, etc. Non-limiting examples of an audible device 156 includes, but is not limited to, a speaker and/or a horn. The warning module 152 includes the electrical components for energizing the one or more illumination sources 154 and/or the one or more audible devices 156. The field detection circuitry 142 is configured to perform and/or control performance of the warning module 152, such as illuminating the one or more illumination sources 154 and/or activating the one or more audible devices 156 in accordance with various example embodiments. In some embodiments, the memory 146 may be in operative communication with one or more of the processor 144 and the warning module 152 via one or more buses for passing information among components of the control apparatus 140.

In some embodiments, the control apparatus 140 includes a communication module 158. The communication module 158 may be configured to enable communication between the control apparatus 140 and another electric field detector 120a-n and/or the equipment 22 (e.g., with control system 30 of equipment 22) directly and/or via one or more computer networks. In this regard, the communication module 158 may include one or more interface mechanisms for enabling communication with other computing devices and/or networks 184. As such, the communication module 158 may include, for example, an antenna (or multiple antennas), a transceiver(s), other supporting hardware and/or software for enabling wireless (for example, via a wireless local area network) and/or wireline communications (for example, via a communication bus, such as a controller area network (CAN) bus, or other wireline communication bus) with another computing device or network 184. Examples of communication technologies that may be supported by various embodiments of the communication module 158 are further described herein below.

In an embodiment, the communication module 158 is configured to support wireless communication among the electric field detectors 120a-n. For wireless communications, the communication module 158 may include a transceiver, for example. In an embodiment, the electric field detectors 120a-n may communicate via an ad hoc (e.g., mesh) network that may be formed among electric field detectors 120a-n within range of each other, e.g., as established by the communication module 158. An example chip that may be provided and/or that may be integrated into the communication module 158 to enable communication over a radio frequency mesh network is provided by a Synapse Wireless, Inc. integrated circuit model number SM220UF1. However, it will be appreciated that other chips and controllers may be used within the scope of the disclosure.

Some non-limiting example of wireless communication technologies that may be used to facilitate formation of an ad hoc network, structured network, and/or direct wireless communication (e.g., peer-to-peer, or P2P) links between two or more electric field detectors 120a-n and which may be supported by the communication module 158 of various embodiments include one or more of an Institute of Electrical and Electronics Engineers (IEEE) 802.15 or other wireless personal area networking technology (e.g., ZigBee™, BLUETOOTH™, and/or the like), near field communication (NFC), IEEE 802.11 or other wireless local area networking communication technology (e.g., Wi-Fi), Wi-Fi Direct, Z-wave, WirelessUSB, WirelessHD, Wireless HART, ultra-wide band (UWB), Wireless Regional Area Network (WRAN), ISA2120a, Radio Frequency Identification (RFID), Infrared (IR), ISM Band, IEEE 1802.15.4, ANT+, 6LoWPAN, Ultra-Wideband, satellite networks, cellular networks, etc. However, it will be appreciated that communication between two or more electric field detectors 120a-n may be provided by any wireless communication technology that may be used to form an ad hoc or structured wireless local area network (LAN), personal area network (PAN), direct (e.g., P2P) communication link or the like within the scope of the disclosure.

In an embodiment, the electric field detectors 120a-n communicate with each other (e.g., to forward warning notifications) by a wired connection, such as may be provided by a communication bus 60 that may be implemented on the equipment 22 of some embodiments. For example, in some embodiments described further herein, the electric field detectors 120a-n may communicate with each other via a controller area network (CAN) bus that may be implemented on the equipment 22 of some embodiments. In various embodiments, the wired connection may be implemented through universal serial bus (USB), FireWire, Thunderbolt, Lightning, serial communications ports/connectors (e.g., D-subminiature serial connection), parallel communications ports/connectors, Ethernet (RJ-45 connector), and/or other wired communication types that may be used to physically interface the electric field detectors 120a-n.

The communication module 158 of some embodiments is configured to send a warning notification to another electric field detector 120a-n in the system and/or receive a warning notification from another electric field detector 120a-n in the system. For example, the communication module 158 of some embodiments is configured to receive the warning notification from one or more of the other electric field detectors 120a-n in the system, and is configured to communicate an indication of the warning notification to its field detection circuitry 142. In an embodiment, the communication module 158 is configured to process or modify the received warning notification and forward the processed or received warning notification to its field detection circuitry 142.

In some embodiments, the electric field detectors 120a-n can act as repeaters to repeat the warning notifications of the overvoltage to other electric field detectors 120a-n within range even though the electric field detectors 120a-n are not within range of the electric field detector 120a-n originating the warning notification. In some embodiments, the electric field detectors 120a-n may connect and communicate with each other via a structured wireless local area network (LAN) and/or personal area network (PAN) network with an access point or master unit. A master unit of the structured network, can, for example, be one of the electric field detectors, e.g. 120a, designated as a master. As another example, in some embodiments, the control system 30 and/or other module or device that may be implemented on the equipment 22 may provide a structured wireless network access point to which one or more electric field detectors 120 may connect.

When implemented on each electric field detector 120a-n, the control apparatus 140 enables each electric field detector 120a-n to detect the voltage in the electric field in the area around the electric field detector 120a-n and determine whether the detected voltage meets or exceeds the voltage threshold, to energize the one or more illumination sources 154 (if provided) and/or the one or more audible devices 156 (if provided), to provide the warning to the operators, to communicate with the other electric field detectors 120a-n in the system, and to communicate with the control system 30 of the equipment 22, in accordance with one or more example embodiments.

The electric field detectors 120a-n can be provided in a variety of places on the equipment 22. For example, in an embodiment, the electric field detectors 120a-n can be positioned at a front of the equipment 22, at a rear of the equipment 22, on the sides of the equipment 22, in high, medium and/or low positions in and around the equipment 22 relative to the ground, and/or in other spatial arrangements that disperse the electric field detectors 120a-n to provide voltage detection coverage throughout the equipment 22. In this way, the electric field detectors 120a-n can detect voltage up above the equipment 22, down between the equipment 22 and the ground, and/or on all sides of the equipment 22, as determined by positioning the electric field detectors 120a-n. In some embodiments, the electric field detectors 120*a-n* can be placed at determined access points and/or at points of service on the equipment 22, including but not limited to engine access points, a hood covering the engine, power take offs, e.g., for connecting ancillary tools, and/or places for the operators to step onto or off of the equipment 22, etc. In some embodiments, electric field detectors 20*a-n* are placed at the corners of the equipment 22, e.g., to provide visibility of warning signals from the electric field detectors 120*a-n* to the operators, as described in more detail below. In addition, in some embodiments, an electric field detector can be positioned in a cab of the equipment 22 where the operator is located for operating the equipment 22 and/or in an operating station of the equipment 22 where the operator is located for operating the equipment 22. Additional and alternative positions to those described and/or shown herein can be used.

In some embodiments, e.g., if the equipment 22 is grounded, one electric field detector 120*d* is placed under the equipment 22, or integrated into an assembly of the equipment 22, to measure a voltage potential between ground and equipment 22. By pointing the electric field detector 120*d* down toward the ground, the electric field detector 120*d* can detect whether there is an electric field between the equipment 22 and the ground, indicating that equipment 22 has become ungrounded. Other electric field detectors 120*a-c* and *e-n* may not be needed in this implementation, but others can be used.

Placement of the electric field detectors 120*a-n* in different locations around the equipment 22 can serve different purposes. For example, in an embodiment, the electric field detectors 120*a-n* can be positioned at a front of the equipment 22, at a rear of the equipment 22, on the sides of the equipment 22, in high, medium and/or low positions in and around the equipment 22 relative to the ground, and/or in other spatial arrangements that disperse the electric field detectors 120*a-n* to provide voltage detection coverage throughout the equipment 22 and the ability of operators to view/hear one or more electric field detectors 120*a-n*. For example, in an embodiment where the electric field detectors 120*a-n* are positioned in the cab of the equipment 22 where the operator is located for operating the equipment 22 and/or in the operating station of the equipment 22 where the operator is located for operating the equipment 22, and the electric field detectors 120*a-n* are positioned around the equipment 22, the electric field detector(s) positioned in the cab and/or in the operating station provides the operator with the ability to view/hear the electric field detector(s) positioned in the cab and/or in the operating station. In some embodiments, the electric field detectors 120*b* and 120*c* can be positioned near the components 26 to detect if the conductor 28 is ungrounded, e.g., became live with respect to the equipment 22. Additionally, or alternatively, the electric field detector 120*a-n* positioned on a front and side of the equipment 22, respectively, can detect voltage from downed lines on the front/side of the equipment 22.

A detection range of the electric field detectors 120*a-n* can overlap each other for full coverage of the area, or a partial area can be covered by the range of the electric field detectors 120*a-n*, based on an implementation. In some embodiments, a range of the electric field detectors 120*a-n* is about ten feet, depending on strength of the voltage in the vicinity. However, it will be appreciated that the range of an electric field detector 120*a-n* can vary depending on a variety of factors, such as, for example, the particular form of field detection circuitry 142 used and the threshold set for detecting the overvoltage condition. In some embodiments, at least the entirety of the equipment 22 interacted with is within a detection range of the group of electric field detectors 120*a-n*.

Figure 4:
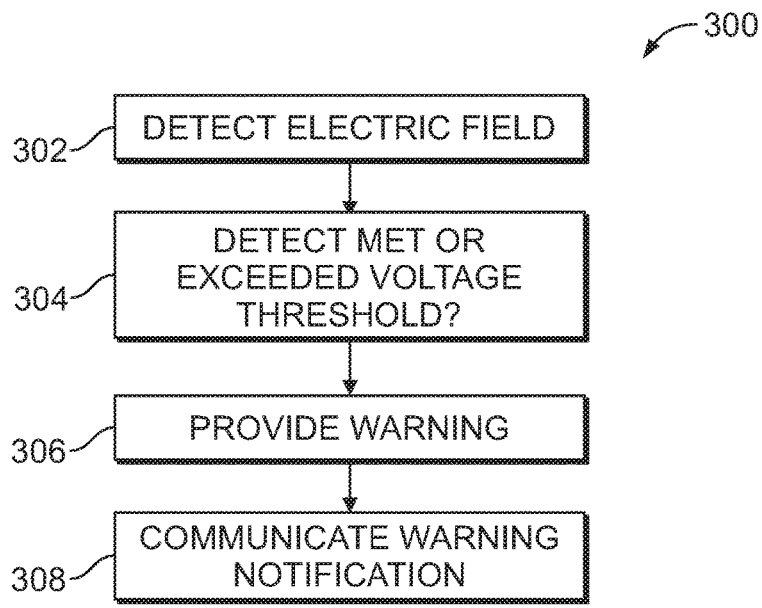

FIG. 4 is a flowchart of an example logic 300 of an electric field detector 120*a-n*. For convenience in description relating to the flowchart of FIG. 4, electric field detector 120*a* is described, with the understanding that the other electric field detectors 120*b-n* operate in the same manner. The electric field detector 120*a* detects the voltage in the electric field in the area around the electric field detector 120*a* (302). The electric field detector 120*a* waits for the voltage threshold in the electric field being detected to be met and/or exceeded and determines that there is an overvoltage in the electric field (304). In response to the determination that there is an overvoltage in the electric field, the electric field detector 120*a* activates its warning module 152 (306). In response to the determination that there is an overvoltage in the electric field, the electric field detector 120*a* communicates a warning notification to the other electric field detectors 120*b-n* in the system (308).

Figure 5:
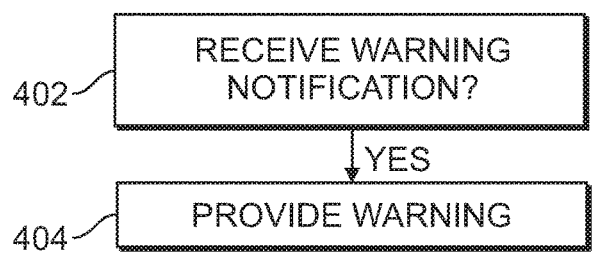

FIG. 5 is a flowchart of an example logic 400 of a second electric field detector 120*a-n* of some embodiments. For convenience in description relating to the flowchart of FIG. 5, electric field detector 120*b* is described, with the understanding that the other electric field detectors 120*a*, 20*c-n* operate in the same manner. In response to receipt of the warning notification (402), the second electric field detector 120*b* activates its warning module 152 (404).

In addition to or alternatively to communication between electric field detectors 120*a-n*, in some embodiments, one or more electric field detectors 120*a-n* may be configured to communicate with the control system 30 of the equipment 22 to cause the equipment 22 to act in response to the detection of the overvoltage.

In this regard, the control system 30 of some embodiments includes a communication module 62, see FIGS. 2 and 8, configured to facilitate communication with one or more electric field detectors 120*a-n* directly and/or via one or more computer networks. In this regard, the communication module 62 may include one or more interface mechanisms for enabling communication with other computing devices and/or networks 184. As such, the communication module 62 may include, for example, an antenna (or multiple antennas), a transceiver(s), other supporting hardware and/or software for enabling wireless (for example, via a wireless local area network) and/or wireline communications (for example, via a controller area network (CAN) bus or other wireline communication bus) with another computing device or network 184. Examples of various communication technologies that may be supported by various embodiments of the communication module 62 are described herein with respect to various embodiments. However, it will be appreciated that the communication module 62 may be configured to support communication via any mode or technology by which the communication module 158 may communicate in accordance with various embodiments.

In some embodiments, communication between the electric field detectors 120*a-n* and the equipment 22 and which may be supported by the communication modules 158, 62 of various embodiments may be configured to communicate with each other wirelessly. For wireless communications, the communication module 62 may include a transceiver, for example. In an embodiment, the communication module 158 of the electric field detectors 120*a-n* and the communication module 62 of the equipment 22 may communicate via an ad hoc (e.g., mesh) network. An example chip that may be provided and/or that may be integrated into the communication module 158 and the communication module 62 to enable communication over a radio frequency mesh network is provided by a Synapse Wireless, Inc. integrated circuit model number SM220UF1. However, it will be appreciated that other chips and controllers may be used within the scope of the disclosure.

Some non-limiting example of wireless communication technologies that may be used to facilitate formation of an ad hoc network, structured network, and/or direct wireless communication (e.g., peer-to-peer, or P2P) links between the electric field detectors 120*a-n* and the equipment 22 of various embodiments include one or more of an Institute of Electrical and Electronics Engineers (IEEE) 802.15 or other wireless personal area networking technology (e.g., ZigBee™, BLUETOOTH™, and/or the like), near field communication (NFC), IEEE 802.11 or other wireless local area networking communication technology (e.g., Wi-Fi), Wi-Fi Direct, Z-wave, WirelessUSB, WirelessHD, Wireless HART, ultra-wide band (UWB), Wireless Regional Area Network (WRAN), ISA2120a, Radio Frequency Identification (RFID), Infrared (IR), ISM Band, IEEE 1802.15.4, ANT+, 6LoWPAN, Ultra-Wideband, satellite networks, cellular networks, etc. However, it will be appreciated that communication between the electric field detectors 120*a-n* and the equipment 22 may be provided by any wireless communication technology that may be used to form an ad hoc or structured wireless local area network (LAN), personal area network (PAN), direct (e.g., P2P) communication link or the like within the scope of the disclosure.

In some embodiments, communication between the electric field detectors 120*a-n* and the control system 30 of the equipment 22 may by operably via a wired connection. In an embodiment, the control system 30 of the equipment 22 includes the communication bus 60, see FIGS. 2 and 10. The communication bus 60 may, for example, be implemented as a controller area network (CAN) bus, but it will be appreciated that other bus types and protocols may be used to implement the communication bus 60. The electric field detector 120*a-n*, may in turn, include a bus connection 80, such as may be provided by the communication module 158 of various embodiments. The bus connection 80 may be physically coupled to the communication bus 60 via cable 82 so as to communicatively couple the electric field detector 120*a-n* to the equipment 22. The cable 82 may be implemented via any physical connection that may be used to communicatively couple a device to a bus, such as communication bus 60. Connections include any type of physical or electronic connection/intercommunication between components that supports appropriate interoperability of components. In various embodiments, the wired connection may be implemented through universal serial bus (USB), FireWire, Thunderbolt, Lightning, serial communications ports/connectors (e.g., D-subminiature serial connection), parallel communications ports/connectors, Ethernet (RJ-45 connector), and/or other wired communication types that may be used to physically interface the electric field detector 120*a-n* with the equipment 22.

The communication module 62 of the equipment 22 of various embodiments is configured to receive the warning notification from one or more of the electric field detectors 120*a-n* in the system, and is configured to communicate an indication of the warning notification to the processing circuitry 34. In an embodiment, the communication module 62 is configured to process or modify the received warning notification and forward the processed or received warning notification to the processing circuitry 34. In an embodiment, in response to the receipt of the indication of the warning notification, the processing circuitry 34 of the equipment 22 propagates a warning notification to the electric field detectors 120*a-n* in the system.

In some embodiments, the equipment 22 includes a warning module 64 which is in operative communication with the processor 36 and the communication module 62 and which includes one or more illumination sources 66 (to provide a visual warning to the operator) and/or one or more audible devices 68 (to provide an audio warning to the operator). The warning module 64 includes the electrical components for energizing the one or more illumination sources 66 and/or the one or more audible devices 68. In some embodiments, the warning module 64 is provided in a cab of the equipment 22 such that one or more illumination sources 66 flashes and/or the one or more audible devices 68 provide an audible indication in the cab of the equipment 22. In some embodiments, the one or more illumination sources 66 are provided by the headlamps of the equipment 22. Non-limiting examples of an illumination source 66 includes, but is not limited to, light emitting diodes (LEDs), incandescent bulbs, gas-based lamps, etc. Non-limiting examples of an audible device 68 includes, but is not limited to, a speaker and/or a horn. In some embodiments, the one or more audible devices 68 are provided in the cab and the one or more illumination sources 66 are provided by the headlamps of the equipment 22. The processing circuitry 34 is configured to perform and/or control performance of the warning module 64 such as illuminating the one or more illumination sources 66 and/or activating the one or more audible devices 68 in accordance with various example embodiments.

Figures 6, 7:
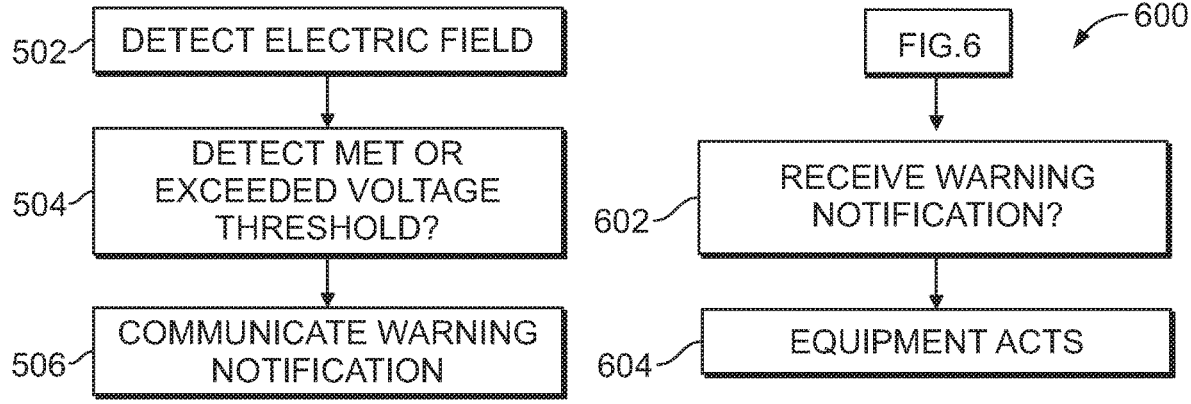

FIG. 6 is a flowchart of an example logic 500 of an electric field detector 120*a-n* of some embodiments. The electric field detector 120*a-n* detects the voltage in the electric field in the area around the electric field detector 120*a-n* (502). The electric field detector 120*a-n* waits for the voltage threshold in the electric field to be met and/or exceeded and determines that there is an overvoltage (504). In response to the determination that there is an overvoltage in the electric field, the electric field detector 120*a-n* communicates a warning notification to the control system 30 of the equipment 22 (508).

In some embodiments, the equipment 22 includes a user interface 65 which is in operative communication with the processor 36 and which receives the warning notification and indicates a warning to the operator. In some embodiments, the user interface 65 is positioned in a cab of the equipment 22 and/or at any location on the equipment 22. In some embodiments, the user interface 65 is provided on an associated computing devices and/or networks 184, including but not limited to, smart phones, tablets, laptops, personal computers (PC). The user interface 65 may take the form of a display. The user interface 65 may display the warning, such as by display text on screen, a designated color (e.g., red), and/or other indicia, etc.

FIG. 7 is a flowchart of an example logic 600 of the equipment 22 of some embodiments. In some embodiments, in response to the receipt of the warning notification from the electric field detector 120*a-n* from the flow chart of FIG. 6, the control system 30 of the equipment 22 acts. In some embodiments, the control system 30 of the equipment 22 acts by performing one or more of 1) activating its warning module 64, 2) stopping operation of the equipment 22 by shutting down operation of the components 26, 3) causing the components 26 of the equipment 22 to act in a particular manner (e.g., by deactivating, limiting movement, or otherwise limiting activity of one or more components 26), 4)

sending a warning notification to the electric field detectors 120a-n, and 5) activating the warning on the user interface 65. In an embodiment where the equipment 22 acts by sending a warning notification to the electric field detectors 120a-n, in response, the electric field detectors 120a-n perform the actions of the flow chart of FIG. 5.

FIG. 8 is a flowchart of an example logic 700 of some embodiments. In some embodiments, in response to the receipt of the warning from the electric field detector 120a-n in the flow chart of FIG. 4 (306) or FIG. 5 (404), the operator of the equipment 22 acts. In some embodiments, the operator of the equipment 22 acts by performing one or more of 1) stopping operation of the equipment 22 by shutting down operation of the components 26, and 2) causing the components 26 of the equipment 22 to act in a particular manner (e.g., by deactivating, limiting movement, or otherwise limiting activity of one or more components 26). Such an action may be performed by an emergency stop button 67 located on the equipment 22 which is in communication with the processing circuitry 34. In an embodiment, the emergency stop button 67 is located in the cab of the equipment 22. In an embodiment, the emergency stop button 67 is located at access points and/or at points of service on the equipment 22.

In an embodiment, if one electric field detector 120a detects overvoltage, then every electric field detector 120b-n indicates the same warning via the warning modules 244. In an embodiment, if one electric field detector 120a detects overvoltage, then every electric field detector 120b-n and the equipment 22 indicates the same warning via the warning modules 244, 64.

In an embodiment, if one electric field detector 120a detects overvoltage, then the electric field detector 120a indicates a warning, but the other electric field detector 120b-n indicate a different warning (e.g., different light color/pattern and/or audible tones/volumes/patterns, etc.) than the one indicated by the electric field detector 120a. In an embodiment, if one electric field detector 120a detects overvoltage, then the electric field detector 120a indicates a warning, but the other electric field detector 120b-n and the equipment 22 indicate a different warning (e.g., different light color/pattern and/or audible tones/volumes/patterns, etc.) than the one indicated by the electric field detector 120a.

In an embodiment, multiple electric field detectors 120a and 120c detect the overvoltage and provide a different warning (e.g., different light color/pattern and/or audible tones/volumes/patterns, etc.) than the electric field detectors 120b and 120d that do not detect the overvoltage, but receive the warning notification and/or repeat the warning. The type of warning can be based on both the received warning notification as well as the voltage detected by the particular electric field detector. In an embodiment, multiple electric field detectors 120a and 120c detect the overvoltage and provide a different warning (e.g., different light color/pattern and/or audible tones/volumes/patterns, etc.) than the equipment 22 and the electric field detectors 120b and 120d that do not detect the overvoltage, but receive the warning notification and/or repeat the warning. The type of warning can be based on both the received warning notification as well as the voltage detected by the particular electric field detector.

In an embodiment, the electric field detectors 120a-n are configured to detect multiple voltage thresholds and the warnings provided by the warning modules 244 indicate field strength of the detected voltage. In an embodiment, the electric field detectors 120a-n are configured to detect multiple voltage thresholds and the warnings provided by the warning modules 244, 64 indicate field strength of the detected voltage. For example, if a first voltage threshold is met, then the electric field detectors 120a-n and/or the equipment 22 provides a warning in a first way; if a second voltage threshold is met, then the electric field detectors 120a-n and/or the equipment 22 provide a warning in a second way which is different (e.g., different light color/pattern and/or audible tones/volumes/patterns, etc.) from the first way; etc. For example, the first way may use the one or more illumination sources 154 and/or 66 to flash at a first rate and/or the one or more audible devices 156 and/or 68 to beep at a first rate; and the second way may use the one or more illumination sources 154 and/or 66 to flash at a second rate which is different from the first rate and/or the one or more audible devices 156 and/or 68 to beep at a second rate which is different from the first rate; etc. As a more particular example, in some such embodiments, there may be a first voltage threshold and a second voltage threshold, with the second voltage threshold being higher than the first voltage threshold. A first electric field detector, for example electric field detector 120a, may detect a voltage exceeding the first voltage threshold, but not the second voltage threshold, and may provide a first warning (e.g., an orange light, a light pattern blinking at a first rate, and/or a first audible tones/volumes/patterns, etc.) while a second electric field detector, for example electric field detector 120b, may detect a voltage exceeding the second voltage threshold and may provide a second warning different than the first warning (e.g., a red light, a light pattern blinking at a second rate, and/or a second audible tones/volumes/patterns, etc.).

Voltage thresholds of the electric field detectors 120a-n can be assigned or dynamically chosen based on the current set of voltages observed in the system. In an embodiment, the operator uses the user interface 65 to assign voltage thresholds of the electric field detectors 120a-n for different applications in which the equipment 22 is being used. For example, the equipment 22 is being used for work on a transmission line (long haul lines, e.g., on towers which transmit higher voltage), in some embodiments, the operator might assign a higher voltage threshold versus if the equipment 22 is being used for work on distribution line (a shorter haul line to homes/neighborhoods, e.g., on poles which transmit lower voltage than the voltage transmitted on distribution lines) where the assigned voltage threshold may be lower.

In an embodiment, when one electric field detector, for example electric field detector 120a, detects one of the voltage thresholds, a warning notification is sent to the other electric field detectors 120b-n that do not detect the overvoltage, and all of the electric field detectors 120a-n provide the same warning. In an embodiment, when one electric field detector 120a detects one of the voltage thresholds, a warning notification is sent to the other electric field detectors 120b-n that do not detect the overvoltage, and electric field detector 120a provides a different warning than the warnings provided by the other electric field detectors 120b-n. In an embodiment, one electric field detector 120a detects one of the voltage thresholds and send a warning notification to the other electric field detectors 120b-n, and another one of the electric field detectors 120b detects the same or a different voltage threshold and sends a warning notification to the other electric field detectors 120a, c, d; wherein electric field detector 120a provides a different warning than electric field detector 120b, and the remaining electric field detectors 120c, d provide further different warnings.

In each embodiment, the different types of warnings can be indicated by the electric field detectors 120a-n using the warning module 152 to provide varying lights, sounds or a combination of lights and sounds, including but not limited to a strength of the light or sound (e.g., a luminous intensity of the light; a loudness, such as may be measured in decibels of the sound; or the like), different light colors, different number of lights illuminated, different audio warning (louder/softer, different tones), etc., that indicate strength of voltage detected.

In an embodiment, the field detection circuitry 142 of each electric field detector 120a-n is configured to control the warning modules 244 such that one or more illumination sources 154 provides constant illumination, varying illumination, and/or turn them on and off in a pattern, etc., to catch the attention of an operators. For example, the electric field detector 120a-n can provide a heartbeat type pattern to indicate that it is actively checking for electric fields having voltage meeting or exceeding the voltage threshold, and a spinning pattern can indicate an electric field and nearby energized conductor 28.

Figure 11:
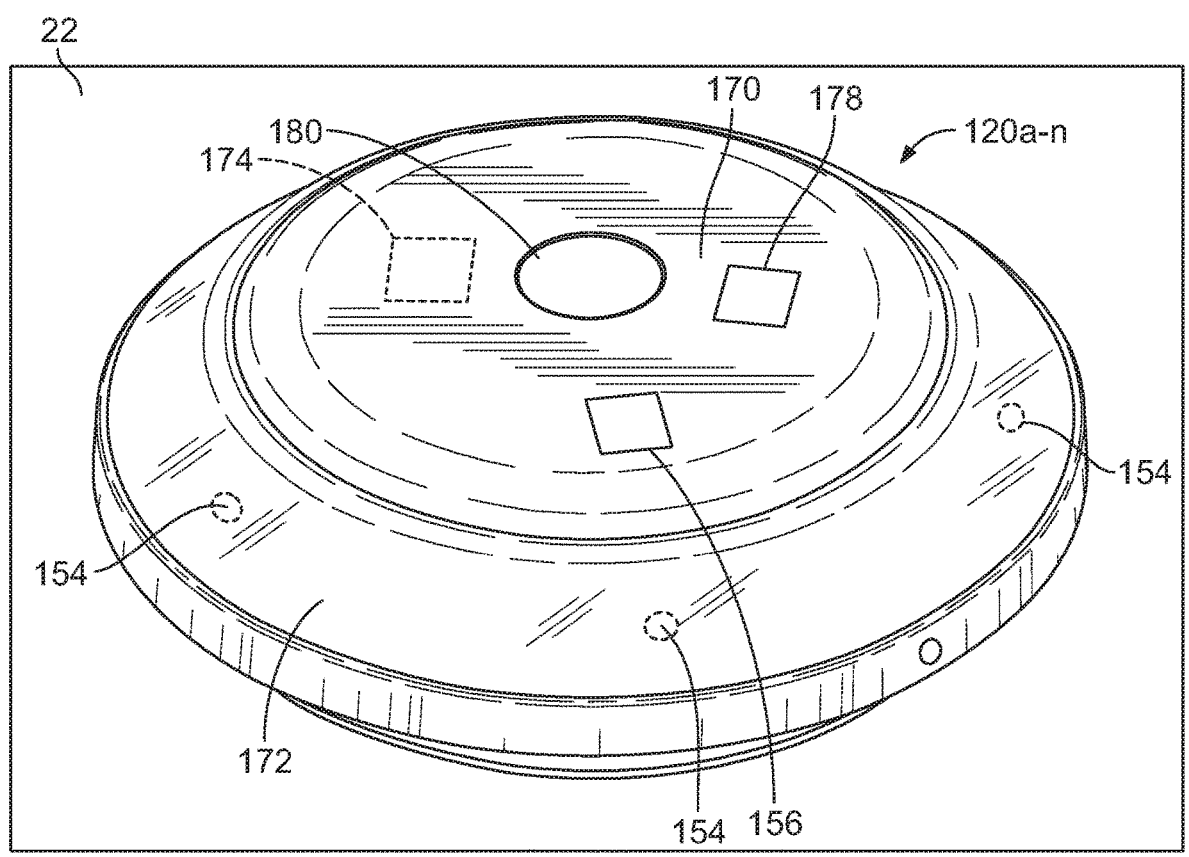
FIG. 11 is a perspective view of a housing for the electric field detector on the piece of equipment.

In some embodiments as shown in FIG. 11, one or more of, or all of, the electric field detectors 120a-n are formed as separate members and are mounted onto the equipment 22. In an embodiment, the one or more of the electric field detector 120a-n includes a housing 170 having a transparent or translucent cover 172, and one or more illumination sources 154 mounted within the housing 170 under the cover 172 to provide a visual warning to the operators that the electric field detector 120a-n has detected an overvoltage. The cover 172 protects and diffuses light from the one or more illumination sources 154. Additionally, or alternatively, one or more electric field detector 120a-n includes one or more audible devices 156 to provide an audio warning to the operators that the electric field detector 120a-n has detected an overvoltage. In an embodiment, the electric field detector 120a-n includes a battery 174 for powering the electric field detector 120a-n.

Figure 12:
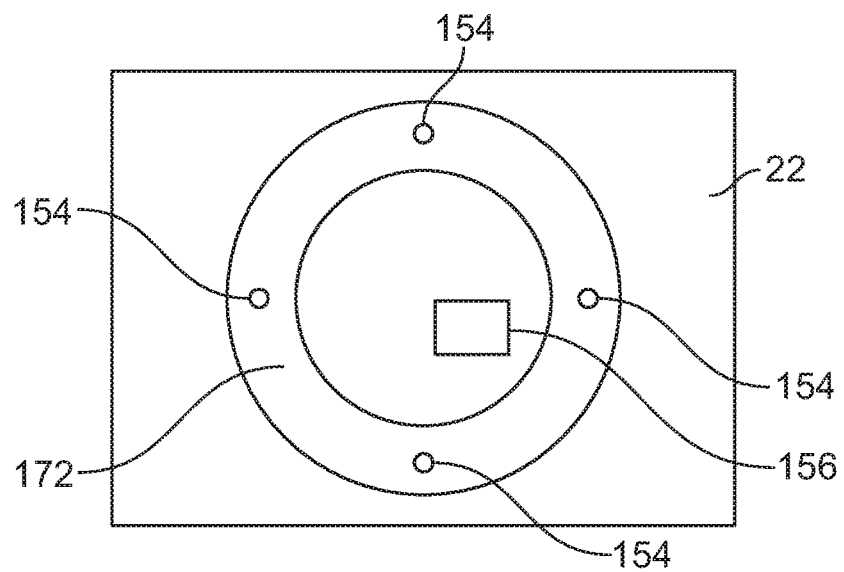
FIGS. 12-14 are side elevation views of the housing for the electric field detector on the piece of equipment.
Figure 13:
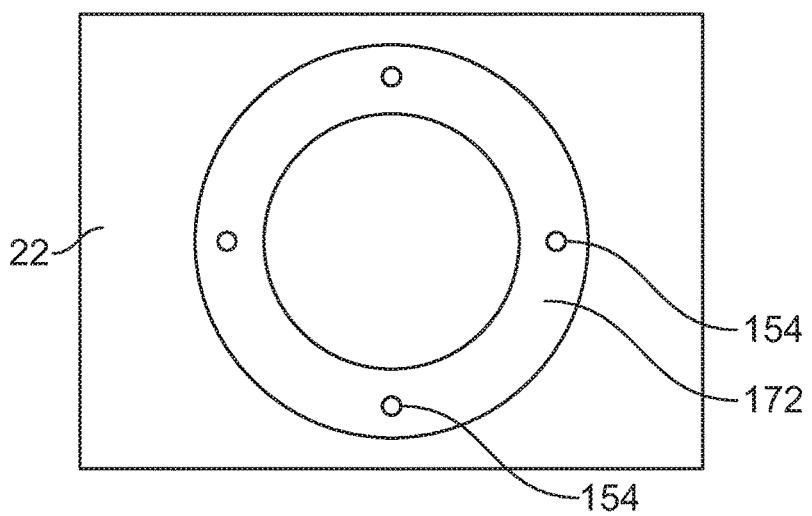
Figure 14:
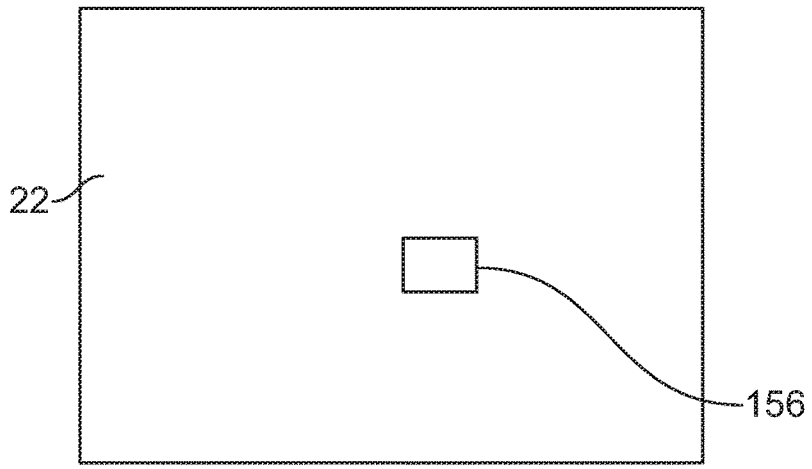

In some embodiments as shown in FIGS. 11-13, one or more of, or all of, the electric field detectors 120a-n are integrally formed with the equipment 22. In some such embodiments, the electric field detectors 120a-n may include the cover 172 affixed to the equipment 22 and the one or more illumination sources 154 and/or the one or more audible devices 156.

In an embodiment, the control apparatus 140 includes a voltage regulator 176, see FIG. 3, which supplies a proper voltage from the battery 174 to the other components of the control apparatus 140. In an embodiment, a low voltage detector 179, see FIG. 3, can monitor a battery charge level of the battery 174 so that the electric field detector 120a-n can notify the operators, e.g., by activating the warning module 152, in a way that varies from the warning of the overvoltage to indicate a low battery charge level. However, it will be appreciated that the electric field detector 120a-n may additionally or alternatively be powered by an electrical system of the equipment 22, and in some embodiments the battery 174 may be omitted. Depending on structural implementation and/or an operator selected deployment configuration, the electric field detectors 120a-n can be configured to be fixedly or removably be mounted on the equipment 22. In some embodiments, the electric field detectors 120a-n are configured to rest on the equipment 22. Additionally, or alternatively, the electric field detectors 120a-n can be removably fastened to the equipment 22 using straps and/or magnets and other types of fasteners. Additionally, or alternatively, the housing 170 of the electric field detector 120a-n may be fastened to the equipment 22 in a manner such that they are not readily removable, such as through riveting, welding, etc.

In an embodiment, the electric field detector 120a-n includes a power button 178. In an example embodiment as shown in FIG. 11, the power button 178 is on a top of the housing 170. In an embodiment, the power button 178 is on a bottom of the housing 170. The power button 178, if provided, can also be used to verify the battery charge level when held down. In an embodiment, the electric field detector 120a-n are activated/deactivated via a user control on the equipment 22 (the power button 178 may be eliminated). In an embodiment, the user control is provided by a button in the cab of the equipment 22 which is in operative communication with the electric field detector 120a-n to activate/deactivate the electric field detector 120a-n.

In some embodiments, the electric field detector 120a-n may include mode selection that can include independent mode select, coordinated mode select, or a selectable channel(s). The mode selection can be selected by a user depressing a mode select button 180 on the electric field detector 120a-n, or additionally or alternatively the mode selection can be selected via a user control panel of the equipment 22. In an example embodiment as shown in FIG. 11, the mode select button 180 is on a top of the housing 170. For example, the electric field detector 120a-n operating in independent mode may only provide a warning if that electric field detector, for example electric field detector 120a, itself, detects voltage, and may not communicate with other electric field detectors 120a-n within range or at least may not repeat warnings from other electric field detectors 120a-n within range. Coordinated mode may set the electric field detector 120a-n to repeat a warning from an electric field detector 120a-n within range that has detected overvoltage. Channel selection may be provided in addition to or in lieu of coordinated mode. In channel select, the electric field detector 120a-n may support communication via a plurality of selectable wireless channels, e.g., 1, 2, 3. For example, electric field detectors 120a-n within range of each other or that are connected to same network that are on channel 1 can display and/or sound warnings together. If one electric field detector 120a-n on channel 1 detects voltage, all electric field detectors on channel 1 can sound warnings, but electric field detectors 120a-n on channel 1 may not repeat any warning from an electric field detector 120a-n on channel 2 that detects overvoltage, such that an electric field detector, for example electric field detector 120a, on channel 2 in such embodiments may only display and/or sound a warning if it or another electric field detector, for example electric field detector 120b, on channel 2 detects overvoltage. The channels can be used to group electric field detectors 120a-n together in the equipment 22, in which all electric field detectors 120a-n of a first portion of the equipment 22 can coordinate separately from electric field detectors 120a-n in a second portion of the equipment 22, as determined by the separate channels.

In an embodiment, the control apparatus 140 includes an emergency stop circuit 182 which is automatically activated in response to detection of overvoltage by the electric field detector 120a-n. In some embodiments, in response to the receipt of the indication of the warning notification, the emergency stop circuit 182 is automatically activated and the motor 32 driving the components 26 is stopped or the motor 32 is shut down thereby stopping the components 26.

In some embodiments, in response to the receipt of the indication of the warning notification, the processing circuitry 34 of the equipment 22 causes the components 26 to act. As an example, in some embodiments, the processing circuitry 34 of the equipment 22 causes the motor 32 driving the components 26 to stop or causes the motor 32 to shut down thereby stopping the components 26. In some embodiments, when the emergency stop button 67 is activated, the motor 32 is stopped thereby stopping the components 26, or the motor 32 is shut down thereby stopping the components 26. In some embodiments, the engine of the cable puller 800 is shut down when the equipment 22 acts or when the operator activates the emergency stop button 67.

In some embodiments, the systems and methods describe electric field detectors 120*a-n* applied to equipment 22 including but not limited to distribution and transmission line stringing and tensioning equipment 22. The equipment 22 can include, but is not limited to, pullers, tensioners, puller-tensioner, and puller/tensioner/reconductorer, reel stands, reel trailers, bucket trucks, backhoes, cranes, digger derrick trucks, other types of construction equipment, non-construction equipment, other equipment used in the presence of high voltage lines, etc., whether for servicing the lines, working around the lines, tree trimming near the lines, etc. In an embodiment, the equipment 22, includes, but is not limited to, equipment 22 that is above ground, underground, overhead. In an embodiment, the equipment 22 has a cab in which the operator sits and the warning module 64 is located in the cab. The voltage may be generated by power lines, cable television lines, telecommunication lines, metal structures in the presence of storms, etc.

Figure 15:
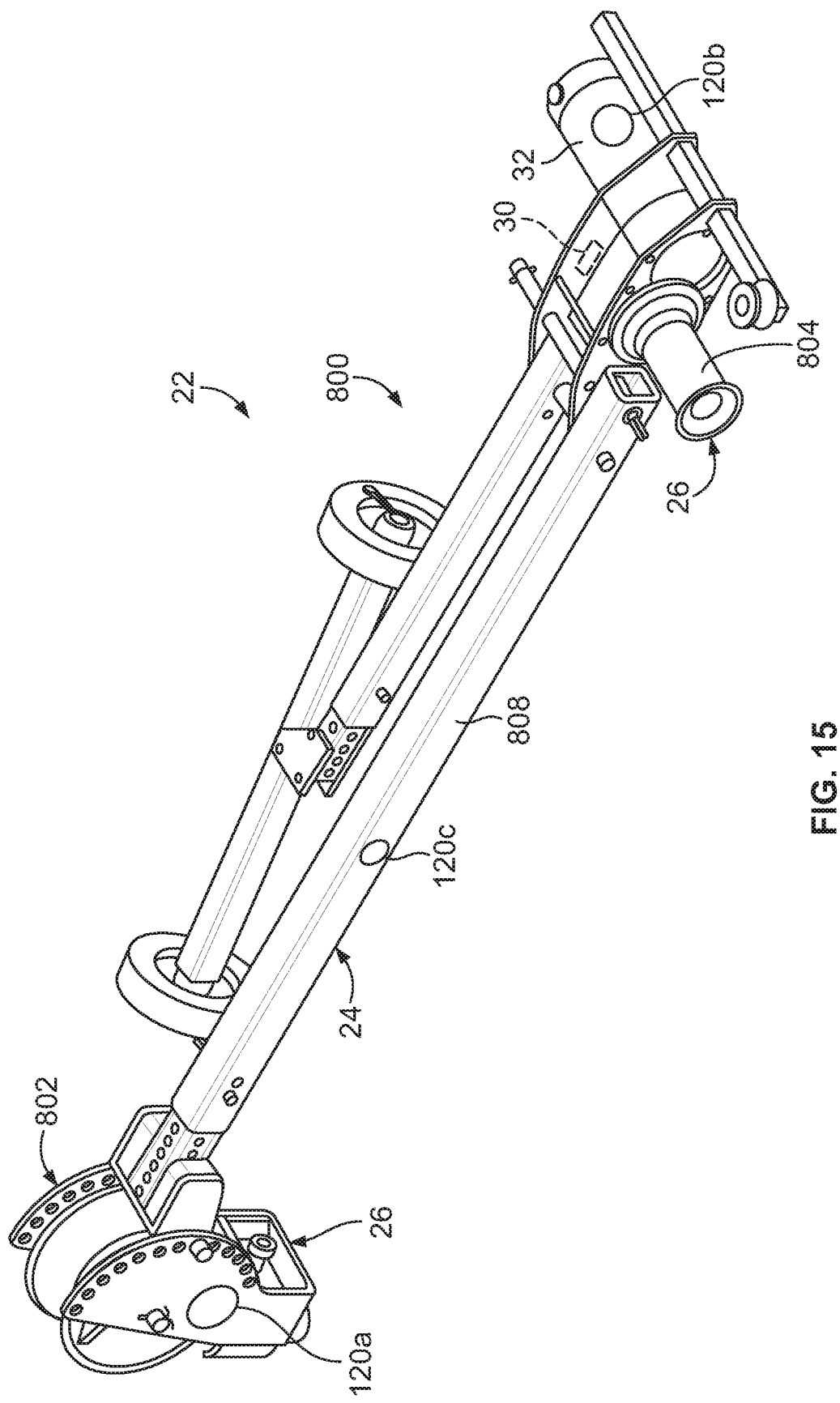
FIG. 15 is a perspective view of a piece of equipment.

In an embodiment, as shown in FIG. 15, the equipment 22 is a cable puller 800 which pulls conductors 28 in the form a cable or wire, and the components 26 on the body 24 are a nose 802 of the cable puller 800 and a driven capstan 804 of the cable puller 800 which come into direct contact with the conductor 28. The capstan 804 is driven by motor 32 which is operatively connected to and controlled by the control system 30 of the equipment 22. As is known in the art, the nose 802 and the capstan 804 are connected by a boom 808. At a minimum, the nose 802 and the capstan 804 of the cable puller 800 form the components 26 of the equipment 22 which come into direct contact with the conductor 28. The electric field detectors 120*a-n* are placed at various locations on the cable puller 800 or are integrated into the cable puller 800. As an example, an electric field detector may be placed on either side of the nose 802, on sides of the boom 808, under the boom 808, on top of the boom 808, proximate to or on the capstan 804. Numerous other locations for positioning the electric field detectors 120*a-n* are within the scope of the disclosure and the positions shown in FIG. 15 are for example purposes only. As an example, in some embodiments, the processing circuitry 34 of the equipment 22 causes the motor 32 driving the capstan 804 to stop rotating the capstan 804 or causes the motor 32 to shut down thereby stopping rotation of the capstan 804; in some embodiments, this occurs automatically by the emergency stop circuit 182 in response to the detection of overvoltage. In some embodiments, when the emergency stop button 67 is activated by the operator, the motor 32 is stopped thereby stopping rotation of the capstan 804, or the motor 32 is shut down thereby stopping rotation of the capstan 804. In some embodiments, the engine of the cable puller 800 is shut down when the cable puller 800 acts or when the operator activates the emergency stop button 67.

Figure 16:
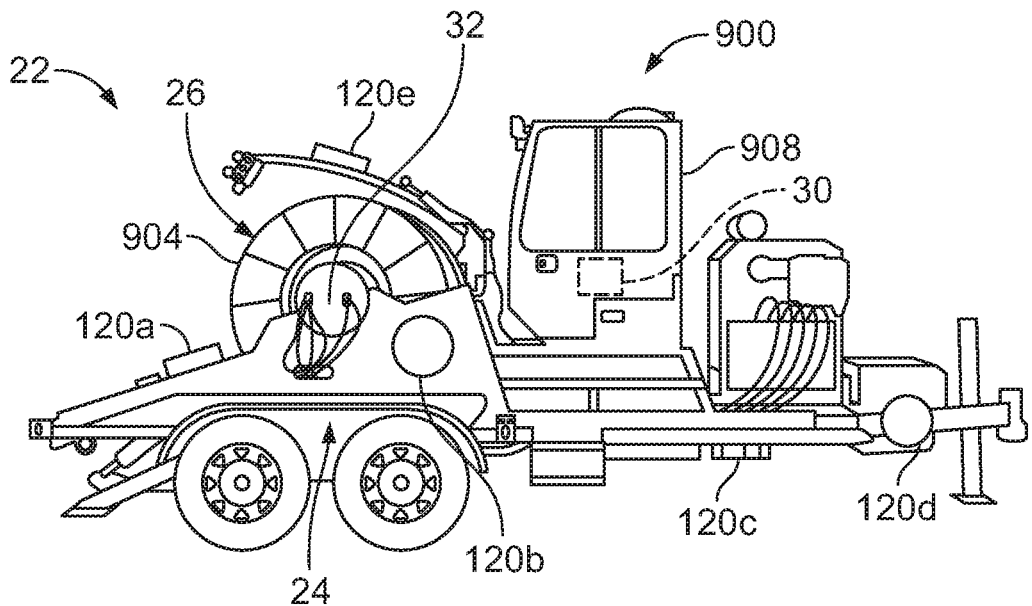
FIG. 16 is a side elevation view of another piece of equipment.

In an embodiment, as shown in FIG. 16, the equipment 22 is a puller/tensioner vehicle 900 which pulls conductors 28 in the form a cable or wire, and the components 26 on the body 24 is a driven cable reel 904, known as a bull wheel, of the puller/tensioner vehicle 900. The cable reel 904 is driven by a motor 32 which is operatively connected to and controlled by the control system 30 of the equipment 22. The electric field detectors 120*a-n* are placed at various locations on the puller/tensioner vehicle 900 or are integrated into the puller/tensioner vehicle 900. As an example, electric field detectors may be placed proximate to the cable reel 904 on either side thereof, by a cab 908 of the puller/tensioner vehicle 900, on top of the puller/tensioner vehicle 900, under the puller/tensioner vehicle 900. Numerous other locations for positioning the electric field detectors 120*a-n* are within the scope of the disclosure and the positions shown in FIG. 16 are for example purposes only. As an example, in some embodiments, the processing circuitry 34 of the equipment 22 causes the motor 32 driving the cable reel 904 to stop rotating the cable reel 904 or the motor 32 is shut down thereby stopping rotation of the cable reel 904; in some embodiments, this occurs automatically by the emergency stop circuit 182 in response to the detection of overvoltage. In some embodiments, when the emergency stop button 67 is activated by the operator, the motor 32 is stopped thereby stopping rotation of the cable reel 904, or the motor 32 is shut down thereby stopping rotation of the cable reel 904. In some embodiments, the engine of the puller/tensioner vehicle 900 is shut down when the puller/tensioner vehicle 900 acts or when the operator activates the emergency stop button 67.

Figure 17:
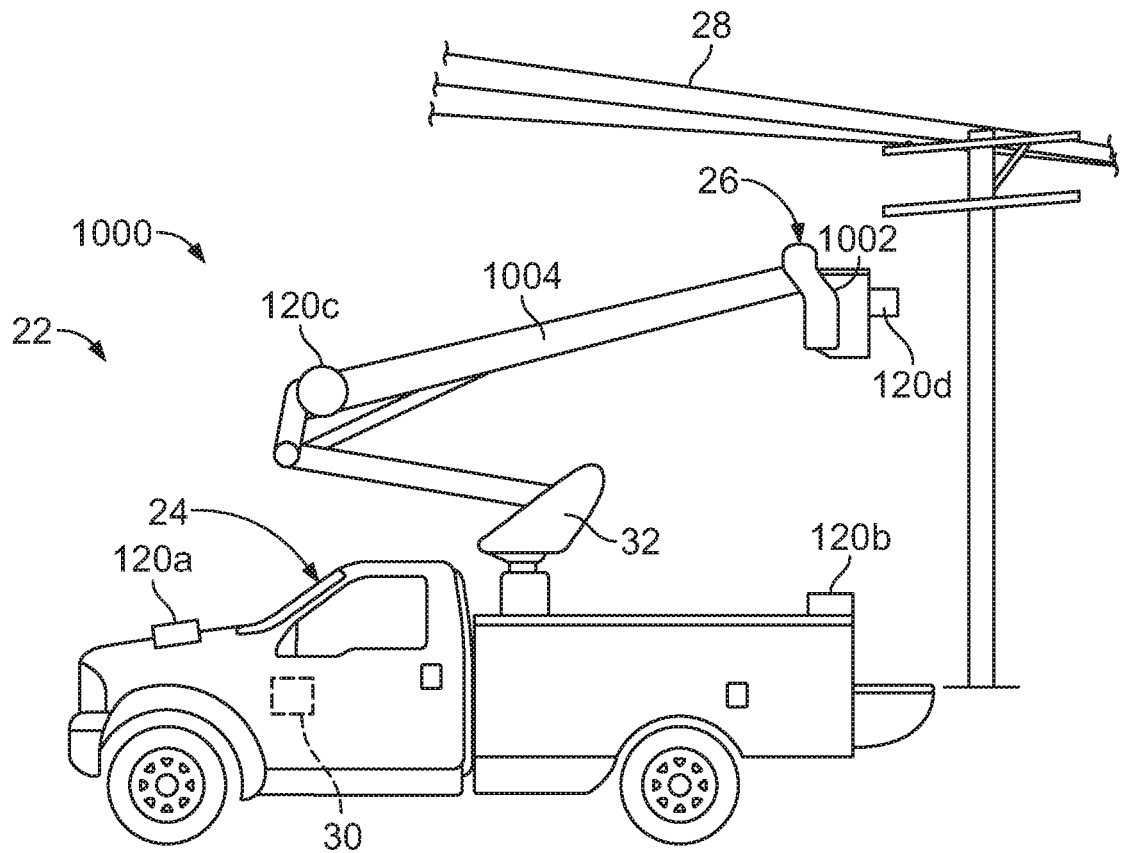
FIG. 17 is a side elevation view of a further piece of equipment.

In an embodiment, as shown in FIG. 17, the equipment 22 is a bucket truck 1000, and the components 26 on the body 24 are a bucket 1002 mounted on a driven boom 1004 that lifts the bucket 1002 into proximity to the conductor 28. The boom 1004 is driven by a motor 32 which is operated by the control system 30 of the bucket truck 1000. The electric field detectors 120*a-n* are placed at various locations on the bucket truck 1000 or are integrated into the bucket truck 1000. As an example, field detectors may be placed on the hood of the bucket truck 1000 and on the bed of the bucket truck 1000, on the boom 1004, on the bucket 1002. Numerous other locations for positioning the electric field detectors 120*a-n* are within the scope of the disclosure and the positions shown in FIG. 17 are for example purposes only. As an example, in some embodiments, the processing circuitry 34 of the equipment 22 causes the motor 32 to stop moving the bucket 1002 and boom 1004, or to lower the bucket 1002 and boom 1004 away from the conductor 28 or causes the motor 32 to shut down thereby stopping movement of the bucket 1002 and boom 1004; in some embodiments, this occurs automatically by the emergency stop circuit 182 in response to the detection of overvoltage. In some embodiments, when the emergency stop button 67 is activated by the operator, the motor 32 is stopped thereby stopping movement of the bucket 1002 and boom 1004, or the motor 32 is shut down thereby stopping movement of the bucket 1002 and boom 1004. In some embodiments, the engine of the bucket truck 1000 is shut down when the bucket truck 1000 acts or when the operator activates the emergency stop button 67.

Figure 18:
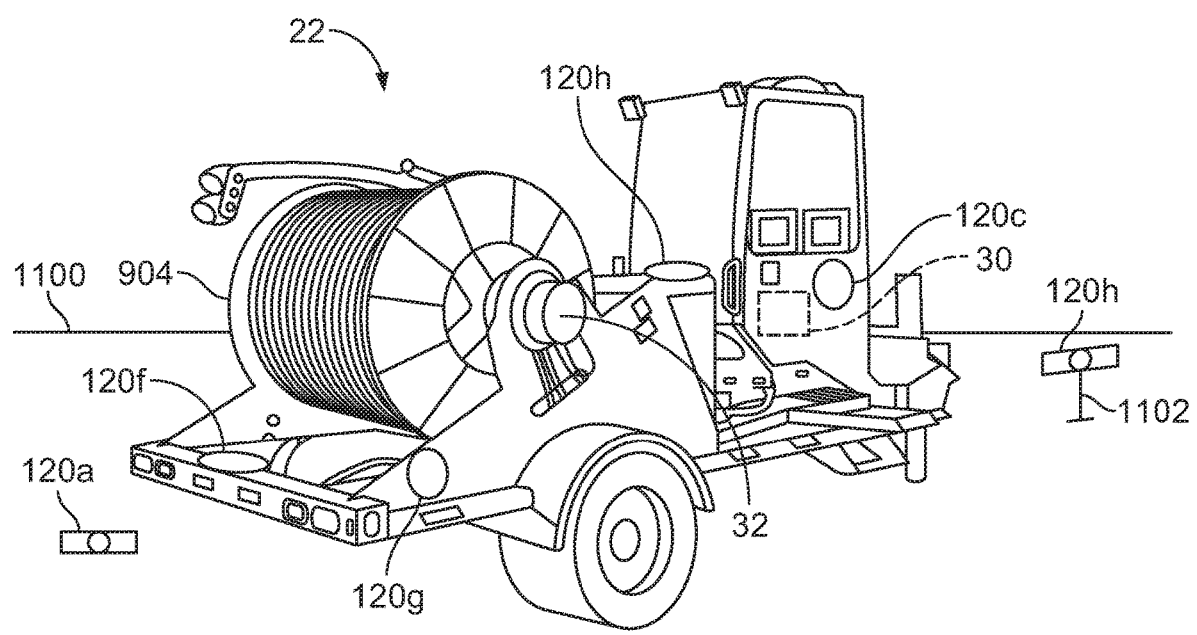
FIG. 18 is a perspective view of yet another piece of equipment.

While the electric field detectors 120*a-n* are described as being provided on or part of the equipment 22, additional electric field detectors 120*a-n* may be provided around the equipment 22 and communicate with the electric field detectors 120*a-n* on the equipment 22 and may communicate with the control system 30 of the equipment 22. FIG. 18 illustrates this situation with the puller/tensioner vehicle 900 being shown for illustrative purposes only. As an example, additional electric field detectors 120*a-n* can be positioned on the ground 1100 by the equipment 22, be placed on the ground under the equipment 22, be positioned on a pole or a cone and/or other stand 1102 surrounding the equipment 22. The electric field detectors 120a-n can help to establish a safe working perimeter around the work area.

While the voltage threshold is described herein as a voltage meeting a certain voltage, the system could be modified to provide a warning if no voltage is detected.

In some embodiments, the electric field detectors 120a-n and/or equipment 22 can additionally or alternatively communicate via the communication modules 158, 62 with various computing devices and/or networks 184 including but not limited to, smart phones, tablets, laptops, personal computers (PC), etc., with communication capability and which may operate on one of a variety of operating systems including but not limited to Microsoft Windows (a registered trademark of Microsoft Corporation), Apple iOS (a registered trademark of Cisco), Apple OSX, Google Android (a registered trademark of Google Inc.), or Linux (a registered trademark owned by Linus Torvalds) to provide warnings to the operators. In some embodiments, the electric field detector 120a-n and/or equipment 22 can communicate the detected overvoltage to computing devices and/or networks 184 not in the area, e.g., a supervisor working in an office located away from the work site, and/or an emergency response unit, etc. In such embodiments, communication between an electric field detector 120 or equipment 22 and another computing device and/or network 184 can be via any form of communication that may be supported by communication modules 158, 62, including various wireless communication technology (e.g., various WLAN, PAN, cellular technologies) and/or communication via various physical connections (e.g., USB, FireWire, Thunderbolt, etc.).

Figure 19:
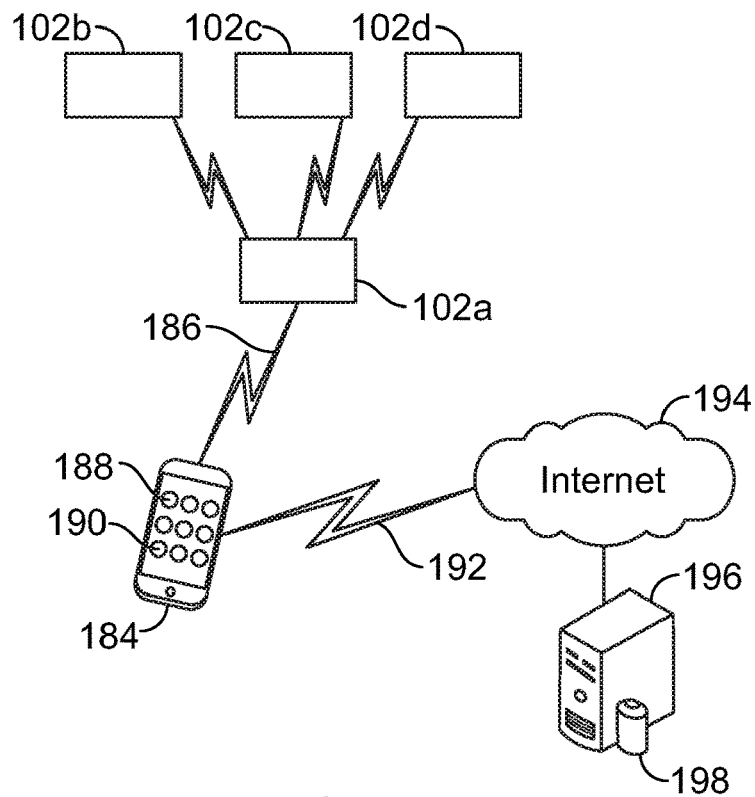
FIG. 19 is an exemplary system in which the piece of equipment and the electric field detectors of FIGS. 1-18 can be used.

With reference to FIG. 19, there is illustrated an exemplary system in which a computing device and/or network 184 is in communication with the control apparatus 140 of the master unit of the structured network, for example the electric field detector 120a, and is used to issue commands to control the master electric field detector 120a, and in turn control the other electric field detectors 120b-n. In the illustrative example of FIG. 19, commands may be issued by the control apparatus 140 of the master electric field detector 120a in response to signals 186 received from an app 188 resident on the computing device and/or network 184. The signals 186 may be sent from the computing device and/or network 184 by radio frequency ("RF"). While wireless communication, etc., between the computing device and/or network 184 and the master electric field detector 120a is illustrated herein as a direct link, it should be appreciated that in some instances such communication may take place via a local area network or personal area network, and as such may involve various intermediary devices such as routers, bridges, access points, etc. Since these items are not necessary for an understanding of the present disclosure, they are omitted from this and subsequent Figures for the sake of clarity.

In an embodiment, the computing device and/or network 184 and the master electric field detector 120a are in bi-directional communication.

Since smart device remote control apps such as that contemplated in the computing device and/or network 184 are well known, for the sake of brevity the operation, features, and functions thereof will not be described in detail herein.

A setup app 190 executing on the computing device and/or network 184 may be utilized in conjunction with an Internet (192, 194) accessible server 196 and associated database 198 to initially configure the master electric field detector 120a for operation with the other the master electric field detectors 120b-n which are to be controlled, i.e., to communicate to the master electric field detector 120a a matching command code set and capability profile for each particular electric field detectors 120b-n to be controlled.

Figure 20:
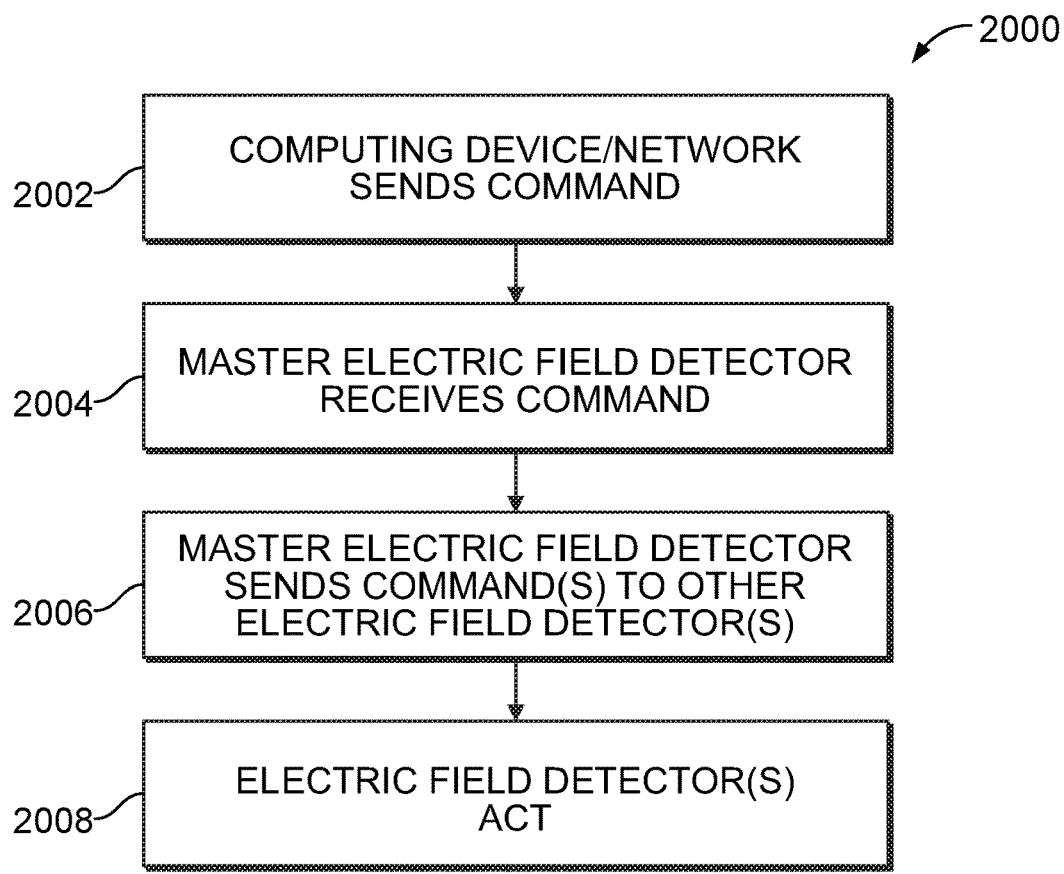
FIG. 20 is a flowchart of an example logic of control of the system shown in FIG. 19.

FIG. 20 is a flowchart of an example logic 2000 of control by the computing device and/or network 184 of the system shown in FIG. 19. The computing device and/or network 184 sends a control command to the master electric field detector 120a (2002). The master electric field detector 120a receives this control command and processes the control command (2004). The master electric field detector 120a sends control commands to the other electric field detector(s) 120b n (2006). The electric field detector(s) 120b-n receive this control command, processes the control command, and then act (2008).

Alternatively, the computing device and/or network 184 may send control commands directly to each of the electric field detectors 120a-n.

Figure 21:
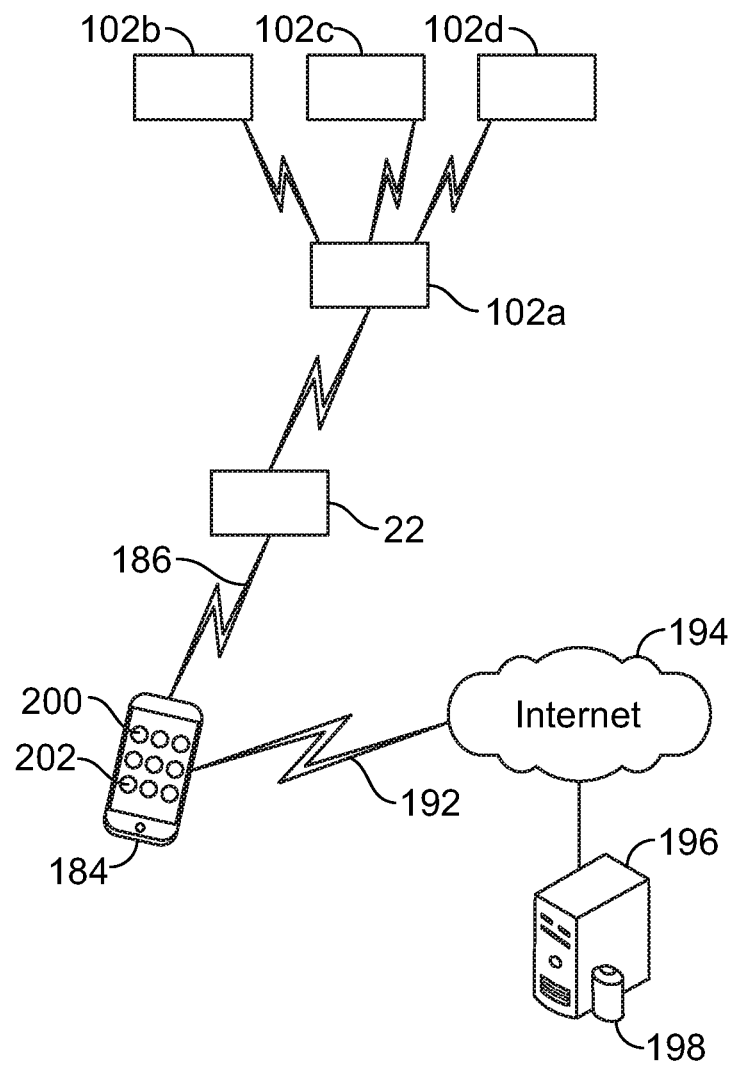
FIG. 21 is another exemplary system in which the piece of equipment and the electric field detectors of FIGS. 1-18 can be used.

With reference to FIG. 21, there is illustrated an exemplary system in which the computing device and/or network 184 is in communication with the control system 30 of the equipment 22 and is used to issue commands to control the electric field detector 120a-n. In the illustrative example of FIG. 21, an app 200 resident on the computing device and/or network 184 is used to send command signals 186 to the control system 30 of the equipment 22. The command signals 186 may be sent from the computing device and/or network 184 by radio frequency ("RF"). While wireless communication, etc., between the computing device and/or network 184 and the control system 30 of the equipment 22 is illustrated herein as a direct link, it should be appreciated that in some instances such communication may take place via a local area network or personal area network, and as such may involve various intermediary devices such as routers, bridges, access points, etc. Since these items are not necessary for an understanding of the present disclosure, they are omitted from this and subsequent Figures for the sake of clarity.

In an embodiment, the computing device and/or network 184 and the control system 30 of the equipment 22 are in bi-directional communication.

Since smart device remote control apps such as that contemplated in the computing device and/or network 184 are well known, for the sake of brevity the operation, features, and functions thereof will not be described in detail herein.

A setup app 202 executing on the computing device and/or network 184 may be utilized in conjunction with an Internet (192, 194) accessible server 196 and associated database 198 to initially configure the control system 30 of the equipment 22 for operation with the electric field detectors 120a-n which are to be controlled, i.e., to communicate to the control system 30 of the equipment 22 a matching command code set and capability profile for each particular electric field detectors 120a-n to be controlled.

Figure 22:
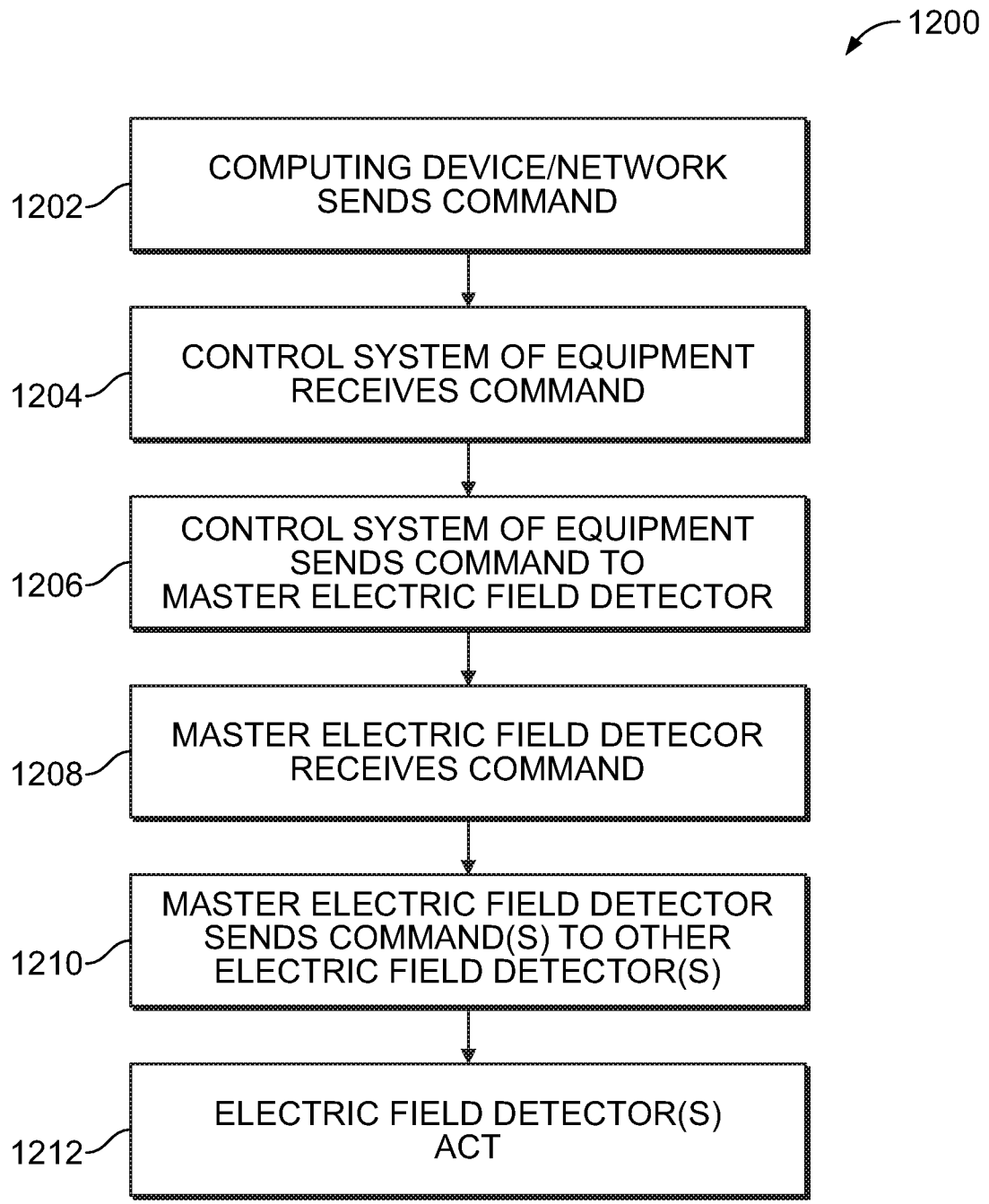
FIG. 22 is a flowchart of an example logic of control of the system shown in FIG. 21.

FIG. 22 is a flowchart of an example logic 1200 of control by the computing device and/or network 184 of the system shown in FIG. 21. The computing device and/or network 184 sends a control command to the control system 30 of the equipment 22 (1202). The control system 30 of the equipment 22 receives this control command and processes the control command (1204). The control system 30 of the equipment 22 sends control command(s) to the master electric field detector 120a (1206). The master electric field detector 120a receives this control command and processes the control command (1208) and then sends control commands to the other electric field detector(s) 120*b-n* (1210). The electric field detector(s) 120*b-n* receive this control command, processes the control command, and then act (1212).

Alternatively, the computing device and/or network 184 may send control commands directly to each of the electric field detectors 120*a-n*.

In either embodiment shown in FIGS. 19-22, the commands may be, for example, to turn individual ones, or all of, the electric field detectors 120*a-n* on or off, to assign voltage thresholds to individual ones, or all of, the electric field detectors 120*a-n*, or to otherwise control parameters of operation of the electric field detectors 120*a-n*.

The processing capability of the systems and processes described herein may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. The systems and methods can be implemented over a cloud.

In some embodiments as shown in FIGS. 23A-33, the systems and methods describe electric field detectors 2020*a-d* applied to an environment 2010, which may be a physical structure or may be a section of the ground. In some embodiments, each electric field detector 2020*a-d* is configured to detect voltage in an electric field in the environment 2010 and to determine whether the detected voltage meets or exceeds a voltage threshold. Directional terms, such as upper, lower, top, bottom, vertical and horizontal, are used herein for ease in description; this does not denote a required orientation during use.

In some embodiments, each electric field detector 2020*a-d* is configured to detect voltage in an electric field in the environment 2010 and to determine whether the detected voltage meets or exceeds one or more voltage thresholds. In response to the detection by the electric field detectors 2020*a-d* that the detected voltage meets or exceeds a voltage threshold (hereinafter called an "overvoltage"), the electric field detectors 2020*a-d* provide a warning to the operators. In response to the detection of overvoltage by one or more of the electric field detectors 2020*a-d*, the electric field detectors 2020*a-d* are configured to communicate a warning notification of the detection of the overvoltage to the other electric field detectors 2020*a-d* in the system. In an embodiment, the voltage threshold is 236 Volts or greater, e.g., at 50 Hz/60 Hz. The electric field detectors 2020*a-d* are configured to receive the warning notification and provide a warning, for example, visual and/or audio warnings, to operators of the presence of the overvoltage in the electric field of the environment 2010. As used herein, the term "operator" or "operators" means a person or persons proximate to, or within, the environment 2010. In some embodiments, the electric field detectors 2020*a-d* detect alternating current (AC) voltage.

While a system providing four electric field detectors 2020*a-d* is shown in FIGS. 23A and 23B, this is not limiting. The system requires at least two electric field detectors for operation of communication and coordinated warnings, but as many electric field detectors as needed may be used. FIGS. 23A and 23B illustrate example environments 2010 for placing electric field detectors 2020*a-d*, e.g., in a grouping to detect voltage within the environment 2010.

The electric field detectors 2020*a-d* can be positioned in a variety of places in, on and around the environment 2010. At least one or more of the electric field detectors 2020*a-d* can be placed in clear view of the operators working in the environment 2010, for example, by placing an electric field detector 2020*a-d* on each side of the environment 2010. For example, in an embodiment, the electric field detectors 2020*a-d* can be positioned at a front of the environment 2010, at a rear of the environment 2010, on the sides of the environment 2010, in high, medium and/or low positions in and around the environment 2010 relative to the ground, and/or in other spatial arrangements that disperse the electric field detectors 2020*a-d* to provide voltage detection coverage throughout the environment 2010 and the ability of workers to view/hear one or more electric field detectors 2020*a-d* throughout the environment 2010. In this way, the electric field detectors 2020*a-d* can detect voltage up above the environment 2010, down between the environment 2010 and the ground, and/or on all sides of the environment 2010, as determined by positioning the electric field detectors 2020*a-d*. Additional and alternative positions to those illustrated in FIGS. 23A and 23B can be used.

Depending on structural implementation and/or an operator selected deployment configuration, the electric field detectors 2020*a-d* can be configured to be fixedly mounted or removably mounted in the environment 2010.

In an embodiment, one or more of the electric field detectors 2020*a-d* includes a housing 2024 having a transparent or translucent cover 2026, and the one or more illumination sources 2028 mounted within the housing 2024 under the cover 2026 to provide a visual warning to the operators that the electric field detector 2020*a-d* has detected an overvoltage. Non-limiting examples of an illumination source 2028 includes, but is not limited to, light emitting diodes (LEDs), incandescent bulbs, gas-based lamps, etc. The cover 2026 protects and diffuses light from the one or more illumination sources 2028. Additionally, or alternatively, one or more of the electric field detectors 2020*a-d* includes one or more audible devices 2030 to provide an audio warning to the operators that the electric field detector 2020*a-d* has detected an overvoltage. Non-limiting examples of an audible device 2030 includes, but is not limited to, a speaker and/or a horn. In an embodiment, the electric field detector 2020*a-d* includes a battery 2032 for powering the electric field detector 2020*a-d*. In an embodiment, the electric field detector 2020*a-d* includes a power button 2034. In an embodiment as shown in FIG. 24, the power button 2034 is on a top of the housing 2024. In an embodiment, the power button 2034 is on a bottom of the housing 2024.

Each electric field detector 2020*a-d* includes a control apparatus 2036. Attention is invited to FIG. 25 which illustrates a block diagram of a control apparatus 2036 that may be implemented on each electric field detector 2020*a-d* in accordance with some example embodiments. In this regard, when implemented on each electric field detector 2020*a-d*, the control apparatus 2036 enables each electric field detector 2020*a-d* to energize the one or more illumination sources 2028 and/or the one or more audible devices 2030 to provide the warning to the operators, and to communicate with the other electric field detectors 2020*a-d* in the system to provide a warning notification, in accordance with one or more example embodiments. It will be appreciated that the components, devices or elements illustrated in and described with respect to FIG. 25 below may not be mandatory and thus some may be omitted in certain embodiments. Additionally, some embodiments may include further or different components, devices or elements beyond those illustrated in and described with respect to FIG. 25.

The control apparatus 2036 includes field detection circuitry 2038 which is configured to detect voltage in the electric field in the environment 2010 and to determine whether the detected voltage meets or exceeds the voltage threshold, and in response to the detection by the field detection circuitry 2038 of an overvoltage and is configurable to perform actions in accordance with one or more example embodiments disclosed herein. The field detection circuitry 2038 may include a processor 2040 and, in some embodiments, such as that illustrated in FIG. 25 may further include memory 2042. An example field detection circuitry 2038 is manufactured by HD Electric Company, for example, as used in the WATCHMAN® work area voltage detector, part number WM-01.

The processor 2040 may be embodied in a variety of forms. For example, the processor 2040 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 2040 may comprise a plurality of processors. The plurality of processors may be in operative communication with each other and may be collectively configured to perform one or more functionalities of the control apparatus 2036 as described herein. In some example embodiments, the processor 2040 may be configured to execute instructions that may be stored in the memory 2042 or that may be otherwise accessible to the processor 2040. Depending on the form of instructions that may be stored in the memory 2042 or otherwise accessed by the processor 2040, such execution of instructions may, for example, include execution of compiled executable code, translation or interpretation of stored program instructions, some combination thereof, or other method through which the processor 2040 may read and execute computer program instructions. As such, whether configured by hardware or by a combination of hardware and software, the processor 2040 is capable of performing operations according to various embodiments while configured accordingly.

The memory 2042 can include one or more of a program memory, a cache, random access memory (RAM), a read only memory (ROM), a flash memory, a hard drive, etc., and/or other types of memory. In some example embodiments, the memory 2042 may include one or more memory devices. Memory 2042 may include fixed and/or removable memory devices. In some embodiments, the memory 2042 may provide a non-transitory computer-readable storage medium that may store computer program instructions that may be executed by the processor 2040. In some embodiments, the memory 2042 may be configured to store information, data, applications, instructions (e.g., compiled executable program instructions, uncompiled program code, some combination thereof, or the like) and/or the like for enabling the control apparatus 2036 to carry out various functions in accordance with one or more example embodiments.

The control apparatus 2036 includes a warning module 2044 in operative communication with the processor 2040 and a communication module 2046 in operative communication with the processor 2040. The warning module 2044 includes the electrical components for energizing the one or more illumination sources 2028 and/or the one or more audible devices 2030 to provide the warning to the operators. In some embodiments, the memory 2042 may be in operative communication with one or more of the processor 2040 and the warning module 2044 via one or more buses for passing information among components of the control apparatus 2036.

In some embodiments, some of the control apparatus 2036 can reside on a printed circuit board assembly (PCBA) 2048, or other type of electrical component assembly, e.g., a 3D printer process assembly mounted in the housing 2024. It will be appreciated that where PCBA 2048 is described, it is described by way of non-limiting example, such that alternative assemblies on which circuitry and/or other electronic components may be embodied may be substituted for PCBA 2048 within the scope of the disclosure, including but not limited to variously configured point-to-point constructed circuits, application-specific integrated circuit (ASIC), field programmable gate array (FPGA), etc. In some embodiments, the field detection circuitry 2038 is located on the PCBA 2048.

Signal conditioning circuitry 2050 can turn signals into digital signals before being received by the field detection circuitry 2038. Additionally, or alternatively, the control apparatus 2036 may include an onboard analog-to-digital converter and/or other circuitry that may be configured to convert analog signals into digital signals, e.g., for processing. In some embodiments, a voltage regulator 2052 can supply a proper voltage from the battery 2032 to the other components of the control apparatus 2036. In some embodiments, a low voltage detector 2054 can monitor a battery charge level of the battery 2032 so that the electric field detector 2020a-d can notify the operators, e.g., by activating the warning module 2044, in a way that varies from the warning of the overvoltage to indicate a low battery charge level. A power button 2056, which operators can use to turn on and off the electric field detector 2020a-d, can also be used to verify the battery charge level when held down. Additional or fewer components may be included on the PCBA 2048 depending on an implementation.

In this regard, the field detection circuitry 2038 may be configured to perform and/or control performance of one or more functionalities of each electric field detector 2020a-d, such as to energize and control operation of the warning module 2044, in accordance with various example embodiments. The field detection circuitry 2038 may be configured to perform data processing, application execution and/or other processing and management services according to one or more example embodiments.

In some embodiments, the control apparatus 2036 or a portion(s) or component(s) thereof, such as the field detection circuitry 2038, may include one or more chipsets and/or other components that may be provided by integrated circuits.

The communication module 2046 is configured to receive the warning notification from one or more of the other electric field detectors 2020a-d in the system, and is configured to communicate an indication of the warning notification to the field detection circuitry 2038. In an embodiment, the communication module 2046 is configured to process or modify the received warning notification and forward the processed or received warning notification to the field detection circuitry 2038. Therefore, the electric field detectors 2020a-d provide a warning to operators positioned in and/or around the environment 2010 of an overvoltage, no matter which of the electric field detectors 2020a-d first detected the overvoltage, via the warning modules 2044.

In an embodiment, the electric field detectors 2020a-d communicate by wireless communication. For wireless communications, the communication module 2046 may include a transceiver, for example. In an embodiment, the electric field detectors 2020a-d may communicate via an ad hoc (e.g., mesh) network that may be formed among electric field detectors 2020a-d within range of each other, e.g., as established by the communication module 2046. An example chip that may be provided and/or that may be integrated into the communication module 2046 to enable communication over a radio frequency mesh network is provided by a Synapse Wireless, Inc. integrated circuit model number SM220UF1. However, it will be appreciated that other chips and controllers may be used within the scope of the disclosure.

In some embodiments, the electric field detectors 2020a-d can act as repeaters to repeat the warning notifications of the overvoltage to other electric field detectors 2020a-d within range even though the electric field detectors 2020a-d are not within range of the electric field detector 2020a-d originating the warning notification. In some embodiments, the electric field detectors 2020a-d may connect and communicate with each other via a structured wireless LAN/PAN network with an access point or master unit. A master unit of the structured network, can, for example, be one of the electric field detectors, e.g. 2020a, designated as a master.

Some non-limiting example of wireless communication technologies that may be used to facilitate formation of an ad hoc network, structured network, and/or direct wireless communication (e.g., peer-to-peer, or P2P) links between two or more electric field detectors 2020a-d include one or more of an Institute of Electrical and Electronics Engineers (IEEE) 802.15 or other wireless personal area networking technology (e.g., ZigBee™, BLUETOOTH™, and/or the like), near field communication (NFC), IEEE 802.11 or other wireless local area networking communication technology (e.g., Wi-Fi), Wi-Fi Direct, Z-wave, WirelessUSB, WirelessHD, Wireless HART, ultra-wide band (UWB), Wireless Regional Area Network (WRAN), ISA100a, Radio Frequency Identification (RFID), Infrared (IR), ISM Band, IEEE 1802.15.4, ANT+, 6LoWPAN, Ultra-Wideband, satellite networks, cellular networks, etc. However, it will be appreciated that communication between two or more electric field detectors 2020a-d may be provided by any wireless communication technology that may be used to form an ad hoc or structured wireless local area network (LAN), personal area network (PAN), direct (e.g., P2P) communication link or the like within the scope of the disclosure.

In response to detection of an overvoltage by one or more of the electric field detectors 2020a-d, the electric field detectors 2020a-d provide a warning to operators to the presence of the overvoltage in the environment 2010 by activating its warning module 2044 to provide the warning. In an embodiment, the field detection circuitry 2038 of the electric field detectors 2020a-d activates the one or more illumination sources 2028 to provide a visual warning to the operators in the environment 2010 and/or activates the one or more audible devices 2030 to provide an audio warning, e.g., beeping, to provide a warning to operators around the electric field detectors 2020a-d.

In an embodiment, if one electric field detector 2020a detects overvoltage, then every electric field detector 2020b-d indicates the same warning via the warning modules 2044.

In an embodiment, if one electric field detector 2020a detects overvoltage, then the electric field detector 2020a indicates a warning, but the other electric field detector 2020b-d indicate a different warning (e.g., different light color/pattern and/or audible tones/volumes/patterns, etc.) than the one indicated by the electric field detector 2020a.

In an embodiment, multiple electric field detectors 2020a and 2020c detect the overvoltage and provide a different warning (e.g., different light color/pattern and/or audible tones/volumes/patterns, etc.) than the electric field detectors 2020b and 2020d that do not detect the overvoltage, but receive the warning notification and/or repeat the warning. The type of warning can be based on both the received warning notification as well as the voltage detected by the particular electric field detector.

In an embodiment, the electric field detectors 2020a-d are configured to detect multiple voltage thresholds and the warnings provided by the warning modules 2044 indicate field strength of the detected voltage. Multiple voltage thresholds can be assigned or dynamically chosen based on the current set of voltages observed in the system. For example, if a first voltage threshold is met, then the electric field detectors 2020a-d provide a warning in a first way; if a second voltage threshold is met, then the electric field detectors 2020a-d provide a warning in a second way which is different (e.g., different light color/pattern and/or audible tones/volumes/patterns, etc.) from the first way; etc. For example, the first way may use the one or more illumination sources 2028 to flash at a first rate and/or the one or more audible devices 2030 to beep at a first rate; and the second way may use the one or more illumination sources 2028 to flash at a second rate which is different from the first rate and/or the one or more audible devices 2030 to beep at a second rate which is different from the first rate; etc. As a more particular example, in some such embodiments, there may be a first voltage threshold and a second voltage threshold, with the second voltage threshold being higher than the first voltage threshold. A first electric field detector, for example electric field detector 2020a, may detect a voltage exceeding the first voltage threshold, but not the second voltage threshold, and may provide a first warning (e.g., an orange light, a light pattern blinking at a first rate, and/or a first audible tones/volumes/patterns, etc.) while a second electric field detector, for example electric field detector 2020b, may detect a voltage exceeding the second voltage threshold and may provide a second warning different than the first warning (e.g., a red light, a light pattern blinking at a second rate, and/or a second audible tones/volumes/patterns, etc.).

In an embodiment, when one electric field detector, for example electric field detector 2020a, detects one of the voltage thresholds, a warning notification is sent to the other electric field detectors 2020b-d that do not detect the overvoltage, and all of the electric field detectors 2020a-d provide the same warning. In an embodiment, when one electric field detector 2020a detects one of the voltage thresholds, a warning notification is sent to the other electric field detectors 2020b-d that do not detect the overvoltage, and electric field detector 2020a provides a different warning than the warnings provided by the other electric field detectors 2020b-d. In an embodiment, one electric field detector 2020a detects one of the voltage thresholds and send a warning notification to the other electric field detectors 2020*b-d*, and another one of the electric field detectors 2020*b* detects the same or a different voltage threshold and sends a warning notification to the other electric field detectors 2020*a*, 2020*c*, 2020*d*; wherein electric field detector 2020*a* provides a different warning than electric field detector 2020*b*, and the remaining electric field detectors 2020*c*, 2020*d* provide further different warnings.

In each embodiment, the different types of warnings can be indicated by the electric field detectors 2020*a-d* using the warning module 2044 to provide varying lights, sounds or a combination of lights and sounds, including but not limited to a strength of the light or sound (e.g., a luminous intensity of the light; a loudness, such as may be measured in decibels of the sound; or the like), different light colors, different number of lights illuminated, different audio warning (louder/softer, different tones), etc., that indicate strength of voltage detected.

In an embodiment, the field detection circuitry 2038 of each electric field detector 2020*a-d* is configured to control the warning modules 2044 such that the one or more illumination sources 2028 provides constant illumination, varying illumination, and/or turn them on and off in a pattern, etc., to catch the attention of operators. For example, the electric field detector 2020*a-d* can provide a heartbeat type pattern to indicate that it is actively checking for electric fields having voltage meeting or exceeding the voltage threshold, and a spinning pattern can indicate an electric field and nearby energized conductor.

In some embodiments, the electric field detectors 2020*a-d* can communicate with other computing devices and/or networks 184 via the communication module 2046, whether or not located in the environment 2010, including but not limited to, smart phones, tablets, laptops, personal computers (PC), etc., with communication capability and which may operate on one of a variety of operating systems including but not limited to Microsoft Windows (a registered trademark of Microsoft Corporation), Apple iOS (a registered trademark of Cisco), Apple OSX, Google Android (a registered trademark of Google Inc.), or Linux (a registered trademark owned by Linus Torvalds). In some embodiments, the electric field detectors 2020*a-d* communicates a warning notification to the other computing devices and/or networks 184 to alert a person that is not in the environment 2010. In addition, the other computing devices and/or networks 184 may be used to assign voltage thresholds to the electric field detectors 2020*a-d*.

In some embodiments, the electric field detector 2020*a-d* may include a mode selection button 2058 that can include independent mode select, coordinated mode select, or a selectable channel(s). For example, the electric field detector 2020*a-d* operating in independent mode may only provide a warning if that electric field detector, for example electric field detector 2020*a*, itself, detects voltage, and may not communicate with other electric field detectors 2020*a-d* within range or at least may not repeat warnings from other electric field detectors 2020*a-d* within range. Coordinated mode may set the electric field detector 2020*a-d* to repeat a warning from an electric field detector 2020*a-d* within range that has detected overvoltage. Channel selection may be provided in addition to or in lieu of coordinated mode. In channel select, the electric field detector 2020*a-d* may include a plurality of channels, e.g., 1, 2, 3. For example, electric field detectors 2020*a-d* within range of each other or that are connected to same network that are on channel 1 can display and/or sound warnings together. If one electric field detector 2020*a-d* on channel 1 detects voltage, all electric field detectors on channel 1 can sound warnings, but electric field detectors 2020*a-d* on channel 1 may not repeat any warning from an electric field detector 2020*a-d* on channel 2 that detects overvoltage, such that an electric field detector, for example electric field detector 2020*a*, on channel 2 in such embodiments may only display and/or sound a warning if it or another electric field detector, for example electric field detector 2020*b*, on channel 2 detects overvoltage. The channels can be used to group electric field detectors 2020*a-d* together in the environment 2010, in which all electric field detectors 2020*a-d* of a first portion of the environment 2010 can coordinate separately from electric field detectors 2020*a-d* in a second portion of the environment 2010, as determined by the separate channels.

FIG. 26 is a flowchart of an example logic 20100 of an electric field detector, for example electric field detector 2020*a*, in view of the environment 2010. The electric field detector 2020*a*, monitors an electric field in the environment 2010 that the electric field detector 2020*a*, is placed in (2020102) by detecting the voltage in the area around the electric field detector 2020*a*. The electric field detector 2020*a*, waits for the voltage threshold to be met and/or exceeded in that environment 2010 (2020104). Additionally, or alternatively, the electric field detector 2020*a*, can receive a warning notification from one or more other electric field detector(s), for example electric field detector 2020*b*, 2020*c* and/or 2020*d*, in the environment 2010 indicating that one or more other electric field detector(s) detected an overvoltage (2020106). Based on one or more of the electric field detectors detecting an overvoltage or receiving a warning notification from another electric field detector that an overvoltage was detected, the electric field detector 2020*a*, provides a warning to the operators via the warning module 2044, e.g. via the one or more illumination sources 2028 and/or via the one or more audible devices 2030 (2020108). The electric field detector(s) that detected the overvoltage communicates a warning notification to the other electric field detectors (2020110).

FIG. 27 is a flowchart of an example logic 20200 of a second electric field detector, for example electric field detector 2020*b*, in view of the environment 2010. The second electric field detector 2020*b*, receives warning notification (20202) from one of more of the other electric field detectors and in response, provides a warning to the operators via its warning module 2044, e.g. via the one or more illumination sources 2028 and/or via the one or more audible devices 2030 (20204).

The processing capability of the systems and processes described herein may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. The systems and methods can be implemented over a cloud.

Figure 28:
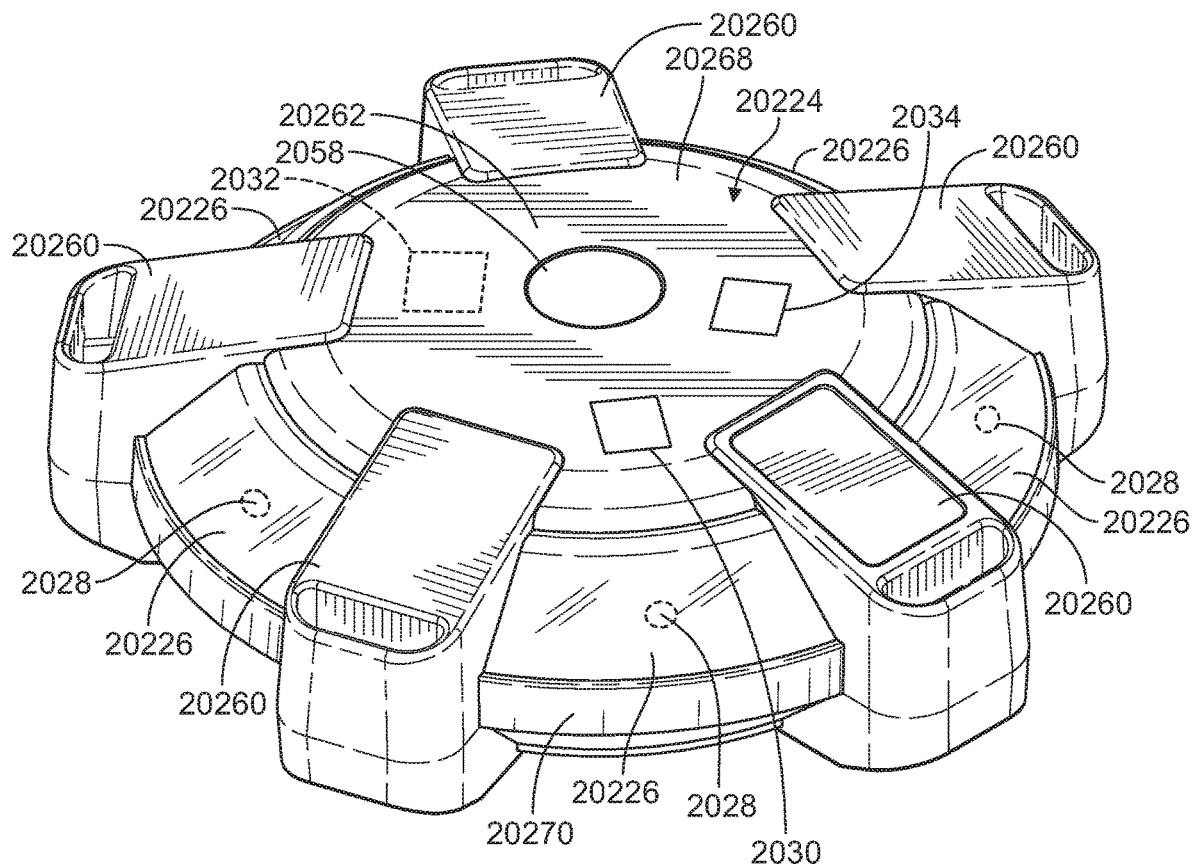
FIG. 28 is a perspective view of an example electric field detector of FIGS. 23A and 23B.
Figure 29:
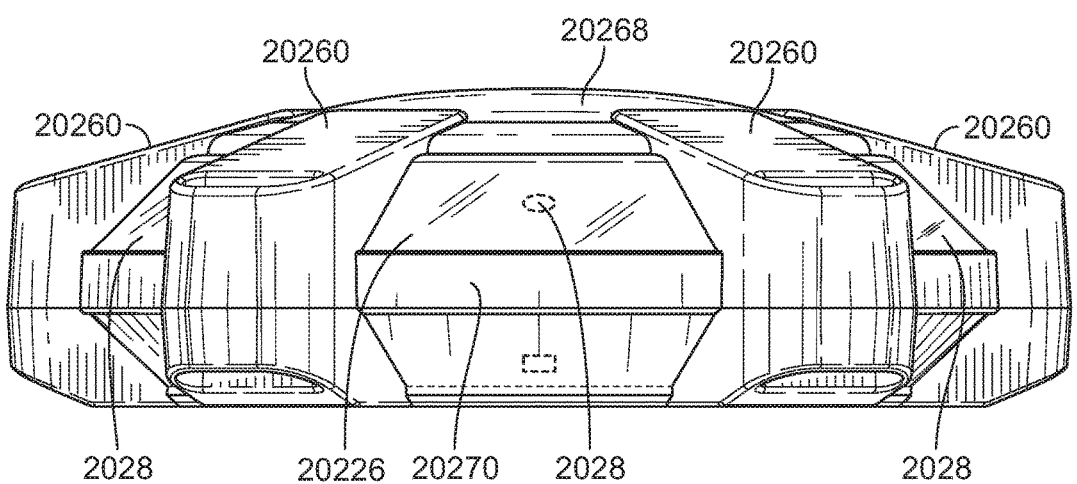
FIG. 29 is a side elevation view of the electric field detector of FIG. 28.
Figure 30:
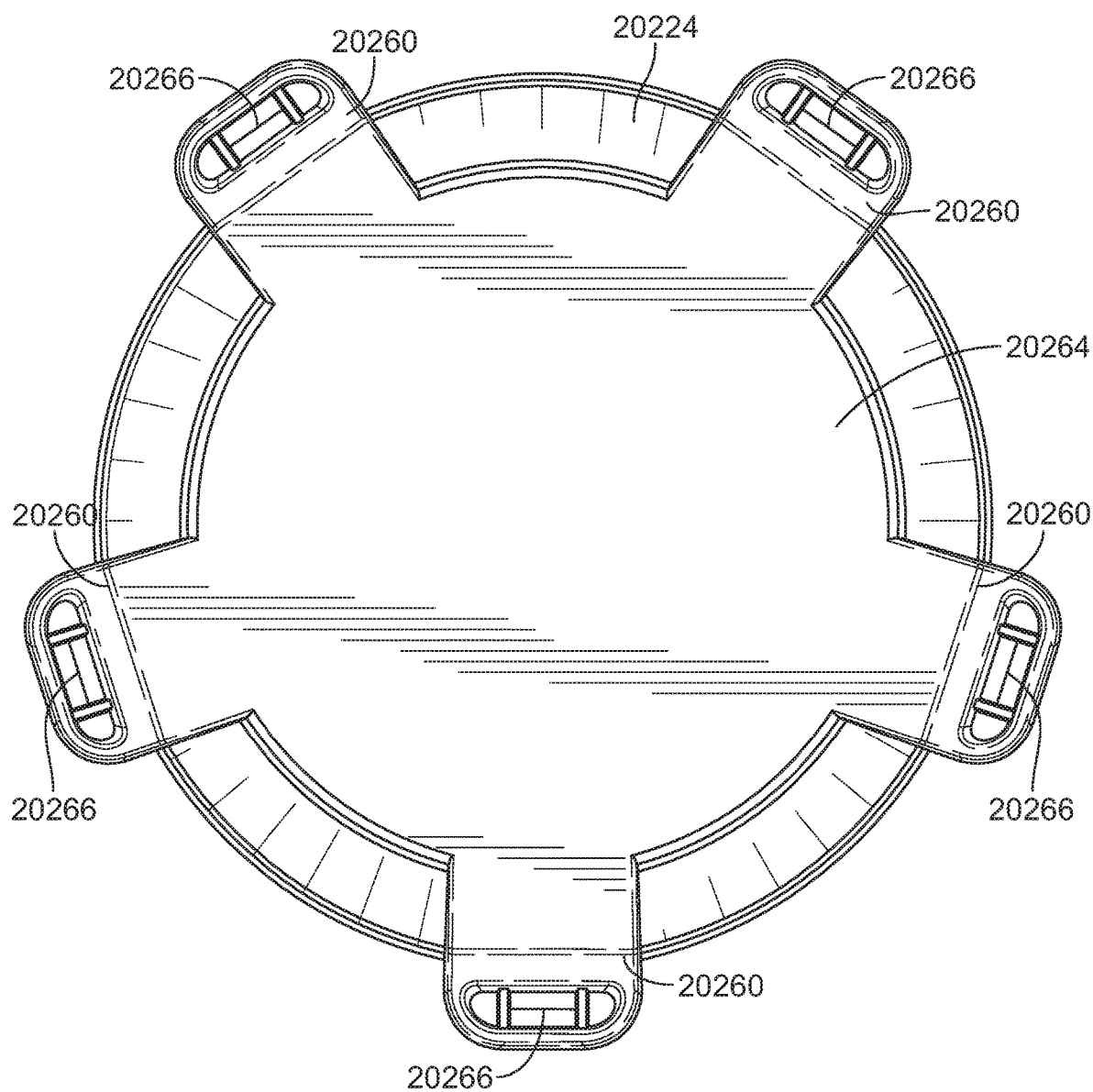
FIG. 30 is a bottom plan view of the electric field detector of FIG. 28.

In an embodiment as shown in FIGS. 28-30, the housing 20224 is generally circularly-shaped housing 20224 and includes legs 20260 extending from a central hub 20262. In some embodiments that shape can be oblong to provide an asymmetric shape around any vertical axis, e.g., to provide a more uniform voltage detection in all directions. Other shapes can be used, e.g., square, rectangular, triangular, rhombus, etc. At the bottom 20264 of the housing 20224, see FIG. 30, the legs 20260 can include bars 20266, e.g., for providing access points to mounting mechanisms to mount the electric field detector 2020*a* in the environment 2010. For example, straps or ropes can be weaved through the bars 20266 to strap the electric field detector 2020*a* to the environment 2010. Additionally, or alternatively, the bars 20266 can mate with corresponding female connectors attached in the environment 2010, etc., to secure the electric field detector 2020*a* to the environment 2010. It will be appreciated, however, that additional or alternative mounting mechanisms can be used to mount an electric field detector 2020*a-d* within an environment 2010 within the scope of the disclosure. In an embodiment, the generally transparent or translucent covers 20226 are positioned between the legs 20260, and from a top 20268 to a side 20270 around the perimeter of the housing 20224, e.g., to be visible from any direction. In some embodiments, the covers 20226 can be angled, e.g., from the top 20268 to the side 20270, to provide a greater surface area of visible light.

Figure 31:
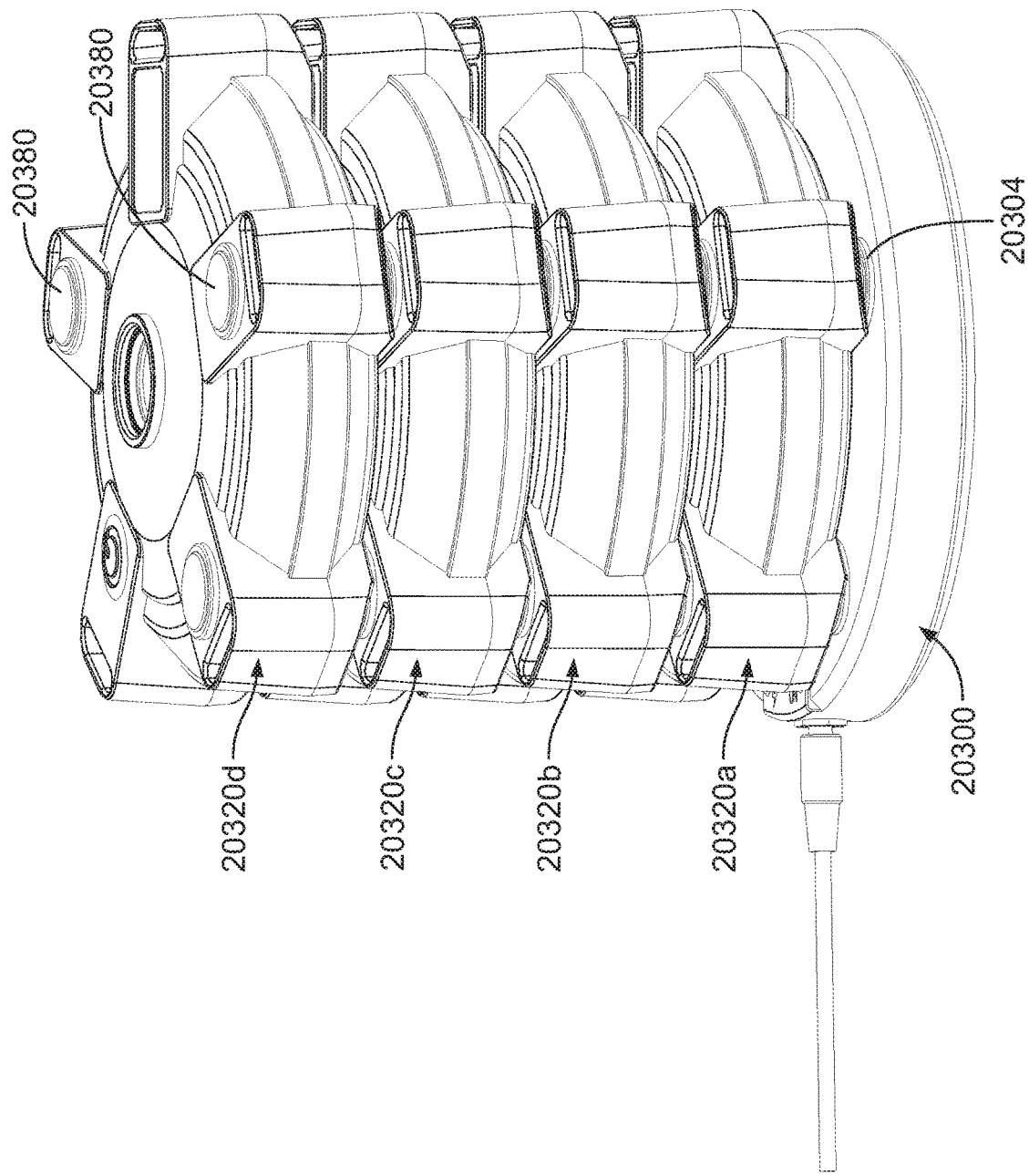
FIG. 31 is a perspective view of an example stack of the electric field detectors of FIGS. 23A and 23B mounted onto a charging station to charge batteries of the electric field detectors of FIGS. 23A and 23B.
Figure 32:
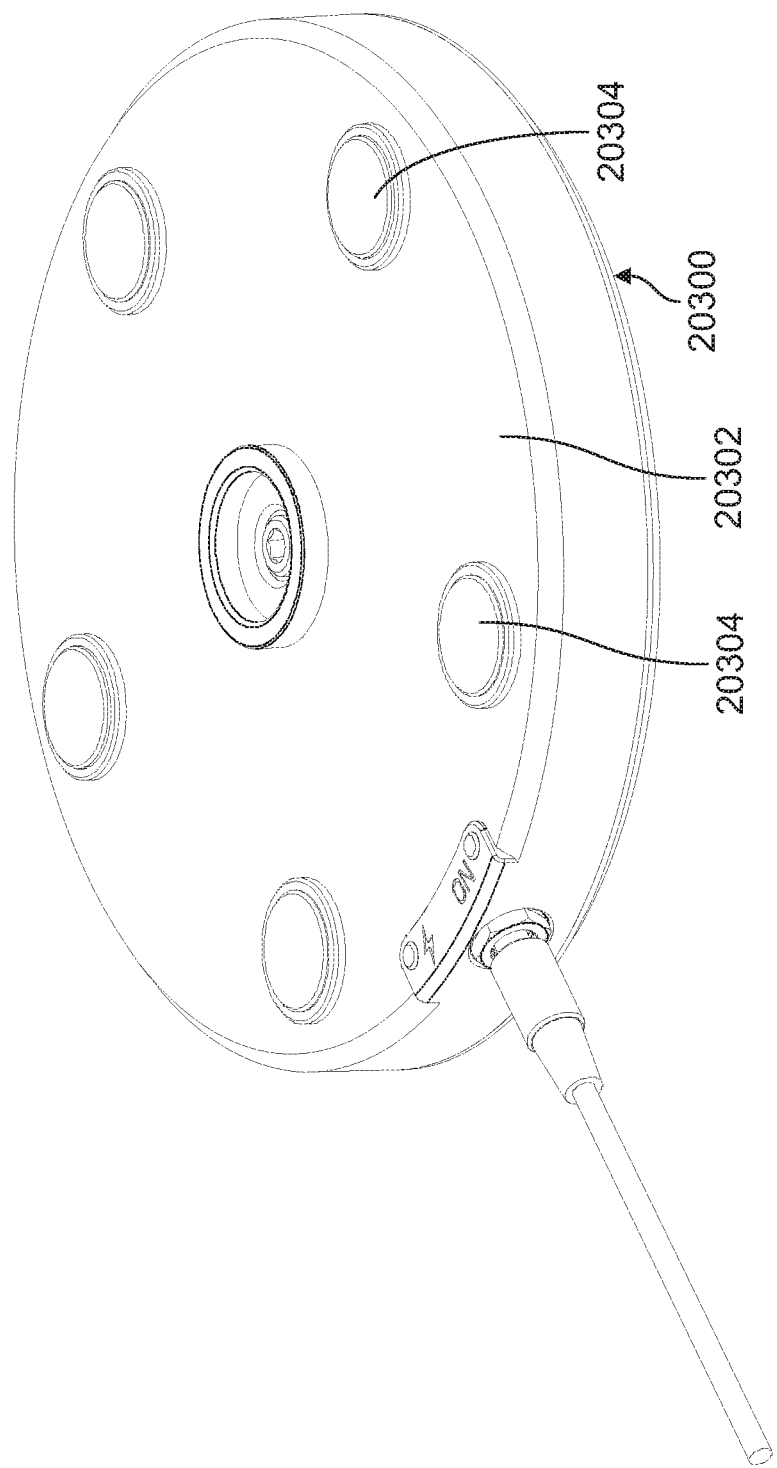
FIG. 32 is a perspective view of an example charging station.
Figure 33:
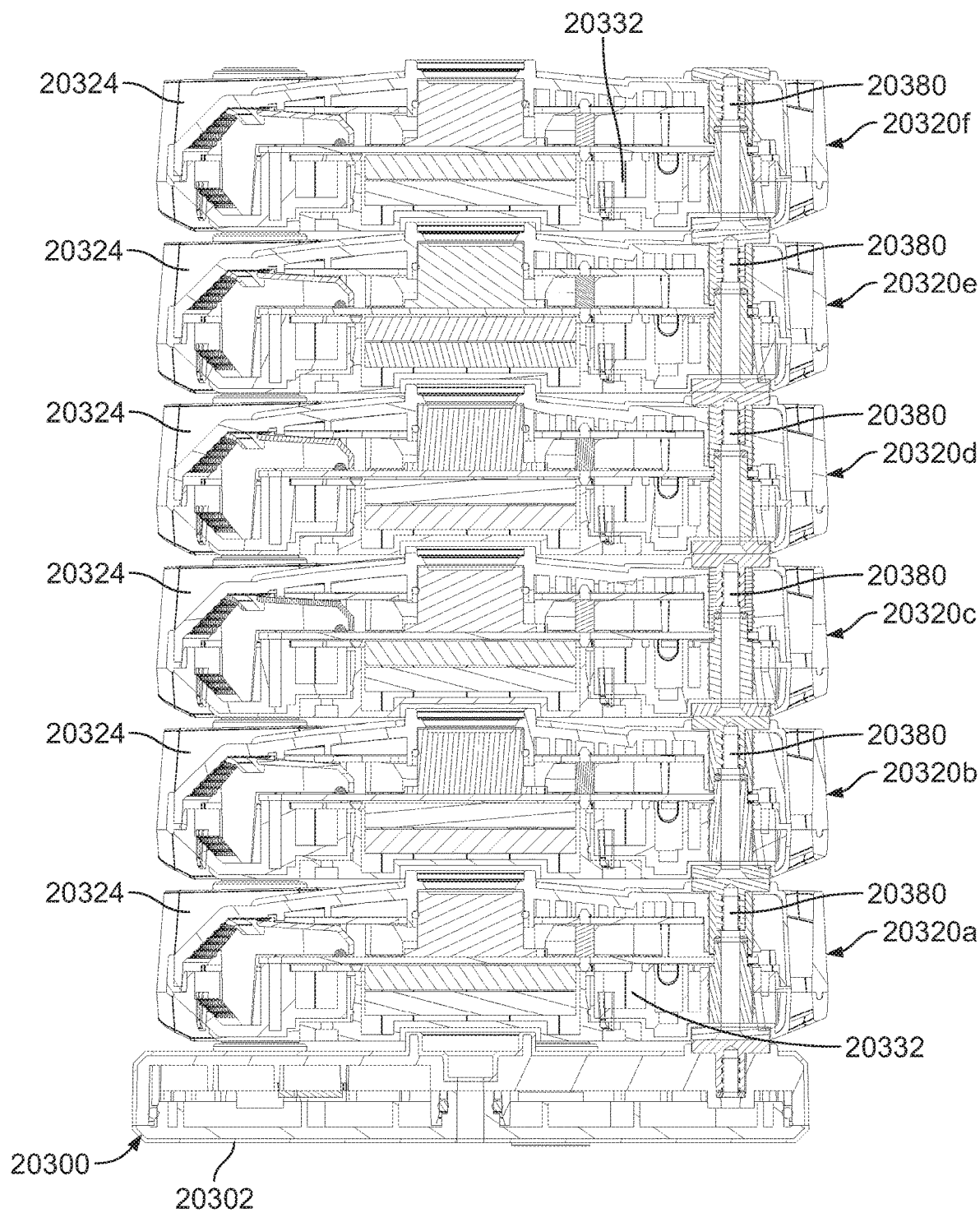
FIG. 33 is a cross-sectional view of the example stack of the electric field detectors of FIGS. 23A and 23B mounted onto the charging station.

In an embodiment, as shown in FIGS. 31-33, the electric voltage detectors 20320*a-f* can be stacked onto each other and onto a charging station 20300 to charge the batteries 20332. In an embodiment, the charging station 20300 includes a base 20302 and plurality of charge pads 20304 provided thereon. Each electric voltage detectors 20320*a-f* has at least one contact 20380 that extends through the housing 20324 and is in electrical communication with the battery 20332. During charging, the contact(s) 20380 on the lowermost electric voltage detector 20320*a* engages the charge pad(s) 20304 on the charging station 20300. The contact(s) 20380 on the stacked electric voltage detectors 20320*a-f* engage one another to provide a continuous electrical path. When the charging station 20300 is activated, all of the batteries 20332 of the electric voltage detectors 20320*a-f* are charged. The electric voltage detectors 20320*a-f* are removed from each other and the charging station 20300 for use in the environment 2010.

Figure 34:
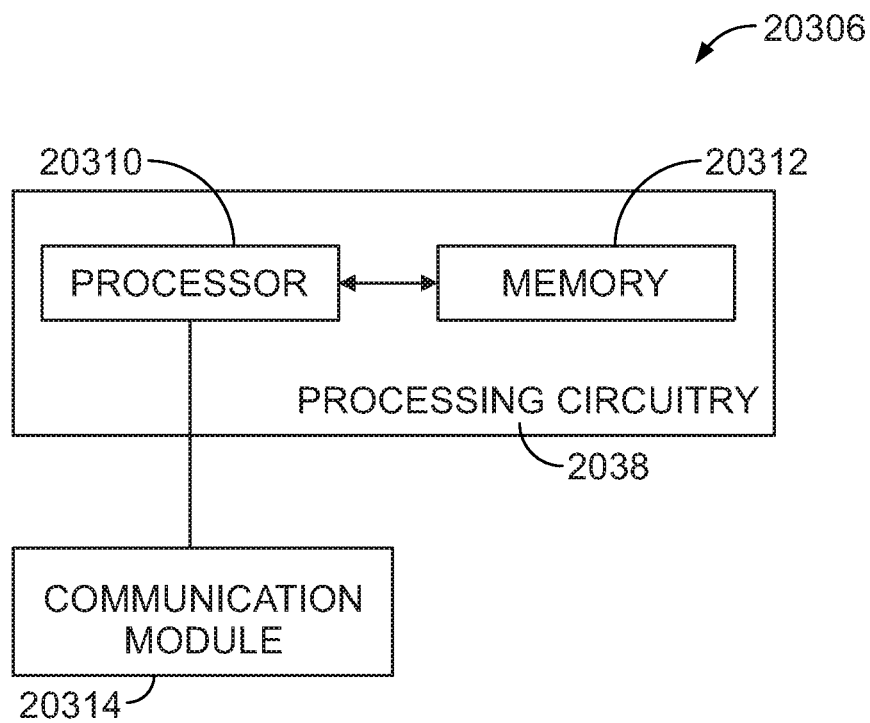
FIG. 34 is a block diagram of a control apparatus of the charging station.

The systems and methods shown in FIGS. 23A-33 which describe electric field detectors 2020*a-d* applied to an environment 2010, can be controlled by using the computing device and/or network 184 like that shown in FIG. 19. In this regard, in some embodiments, the charging station 20300 includes a control apparatus 20306, see FIG. 34, which is configured to receive commands from the computing device and/or network 184 and send commands to the electric field detectors 2020*a-d*.

The control apparatus 20306 of the charging station 20300 includes processing circuitry 20308 that is configurable to perform actions in accordance with one or more example embodiments disclosed herein. The processing circuitry 20308 may be configured to perform data processing, application execution and/or other processing and management services according to one or more example embodiments.

The processing circuitry 20308 may include a processor 20310 and, in some embodiments, such as that illustrated in FIG. 21 may further include memory 20312.

The processor 20310 may be embodied in a variety of forms. For example, the processor 20310 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 20310 may comprise a plurality of processors. The plurality of processors may be in operative communication with each other and may be collectively configured to perform one or more functionalities of the control apparatus 20306 as described herein. In some example embodiments, the processor 20310 may be configured to execute instructions that may be stored in the memory 20312 or that may be otherwise accessible to the processor 20310. Depending on the form of instructions that may be stored in the memory 20312 or otherwise accessed by the processor 20310, such execution of instructions may, for example, include execution of compiled executable code, translation or interpretation of stored program instructions, some combination thereof, or other method through which the processor 20310 may read and execute computer program instructions. As such, whether configured by hardware or by a combination of hardware and software, the processor 20310 is capable of performing operations according to various embodiments while configured accordingly.

The memory 20312 can include one or more of a program memory, a cache, random access memory (RAM), a read only memory (ROM), a flash memory, a hard drive, etc., and/or other types of memory. In some example embodiments, the memory 20312 may include one or more memory devices. Memory 20312 may include fixed and/or removable memory devices. In some embodiments, the memory 20312 may provide a non-transitory computer-readable storage medium that may store computer program instructions that may be executed by the processor 20310. In some embodiments, the memory 20312 may be configured to store information, data, applications, instructions (e.g., compiled executable program instructions, uncompiled program code, some combination thereof, or the like) and/or the like for enabling the control apparatus 20306 to carry out various functions in accordance with one or more example embodiments.

The control apparatus 20306 includes a communication module 20314 in operative communication with the processor 20310. In some embodiments, the memory 20312 may be in operative communication with the processor 20310 via one or more buses for passing information among components of the control apparatus 20306.

In some embodiments, some of the control apparatus 20306 can reside on a printed circuit board assembly (PCBA), or other type of electrical component assembly, e.g., a 3D printer process assembly mounted in the base 20302. It will be appreciated that where PCBA is described, it is described by way of non-limiting example, such that alternative assemblies on which circuitry and/or other electronic components may be embodied may be substituted for PCBA within the scope of the disclosure, including but not limited to variously configured point-to-point constructed circuits, application-specific integrated circuit (ASIC), field programmable gate array (FPGA), etc.

In this regard, the processing circuitry 20308 may be configured to perform and/or control performance of one or more functionalities of each electric field detector 2020*a-d*, such as to energize the electric field detector 2020*a-d* and to set voltage thresholds, in accordance with various example embodiments. The processing circuitry 20308 may be configured to perform data processing, application execution and/or other processing and management services according to one or more example embodiments.

In some embodiments, the control apparatus 20306 or a portion(s) or component(s) thereof, such as the processing circuitry 20308, may include one or more chipsets and/or other components that may be provided by integrated circuits.

The communication module 20314 is configured to receive commands from the computing device and/or network 184, and is configured to communicate command signals to the electric field detectors 2020a-d for operation.

In an embodiment, the communication module 20314 communicate by wireless communication. For wireless communications, the communication module 2046 may include a transceiver, for example. Some non-limiting example of wireless communication technologies that may be used to facilitate formation of wireless communication (e.g., peer-to-peer, or P2P) links between the communication module 20314 and the electric field detectors 2020a-d include one or more of an Institute of Electrical and Electronics Engineers (IEEE) 802.15 or other wireless personal area networking technology (e.g., ZigBee™, BLUETOOTH™, and/or the like), near field communication (NFC), IEEE 802.11 or other wireless local area networking communication technology (e.g., Wi-Fi), Wi-Fi Direct, Z-wave, WirelessUSB, WirelessHD, Wireless HART, ultra-wide band (UWB), Wireless Regional Area Network (WRAN), ISA100a, Radio Frequency Identification (RFID), Infrared (IR), ISM Band, IEEE 1802.15.4, ANT+, 6LoW-PAN, Ultra-Wideband, satellite networks, cellular networks, etc. However, it will be appreciated that such communication may be provided by any wireless communication technology that may be used to form an ad hoc or structured wireless local area network (LAN), personal area network (PAN), direct (e.g., P2P) communication link or the like within the scope of the disclosure.

Figure 35:
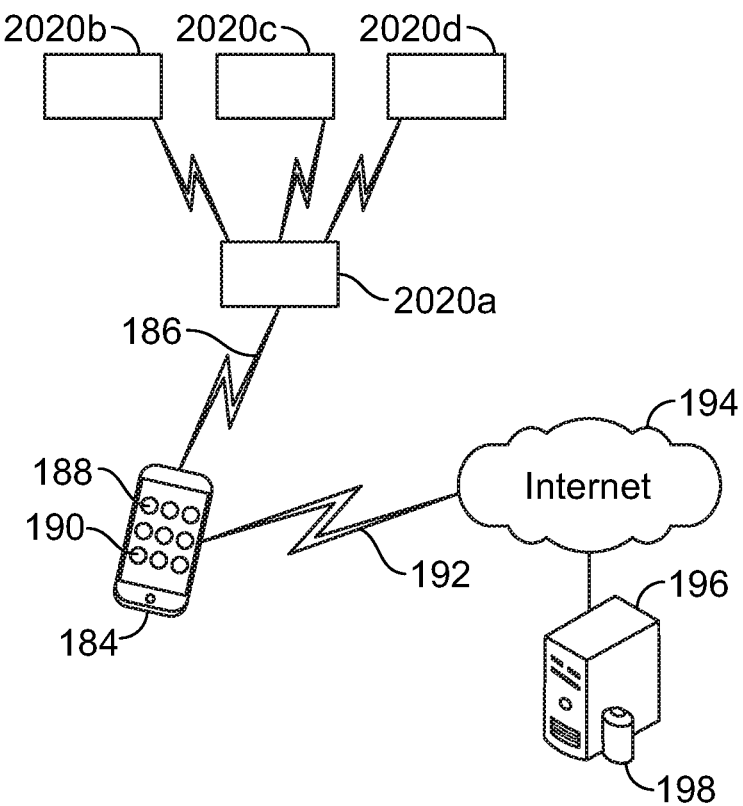
FIG. 35 is an exemplary system in which the electric field detectors of FIGS. 23-30 can be used, or the electric field detectors and the charging station of FIGS. 23-33 can be used.

As shown in FIG. 35, there is illustrated an exemplary system in which the computing device and/or network 184 is in communication with the control apparatus 2036 of a master unit of the structured network, for example the electric field detector 2020a, and is used to issue commands to control the master electric field detector 2020a, and in turn control the other electric field detectors 2020b-d. In the illustrative example of FIG. 35, commands may be issued by the control apparatus 2036 of the master electric field detector 2020a in response to signals 186 received from an app 188 resident on the computing device and/or network 184. The signals 186 may be sent from the computing device and/or network 184 by radio frequency ("RF"). While wireless communication, etc., between the computing device and/or network 184 and the master electric field detector 2020a is illustrated herein as a direct link, it should be appreciated that in some instances such communication may take place via a local area network or personal area network, and as such may involve various intermediary devices such as routers, bridges, access points, etc. Since these items are not necessary for an understanding of the present disclosure, they are omitted from this and subsequent Figures for the sake of clarity.

In an embodiment, the computing device and/or network 184 and the master electric field detector 2020a are in bi-directional communication.

Since smart device remote control apps such as that contemplated in the computing device and/or network 184 are well known, for the sake of brevity the operation, features, and functions thereof will not be described in detail herein.

A setup app 190 executing on the computing device and/or network 184 may be utilized in conjunction with an Internet (192, 194) accessible server 196 and associated database 198 to initially configure the master electric field detector 2020a for operation with the other the master electric field detectors 2020b-d which are to be controlled, i.e., to communicate to the master electric field detector 2020a a matching command code set and capability profile for each particular electric field detectors 2020b-d to be controlled.

Figure 36:
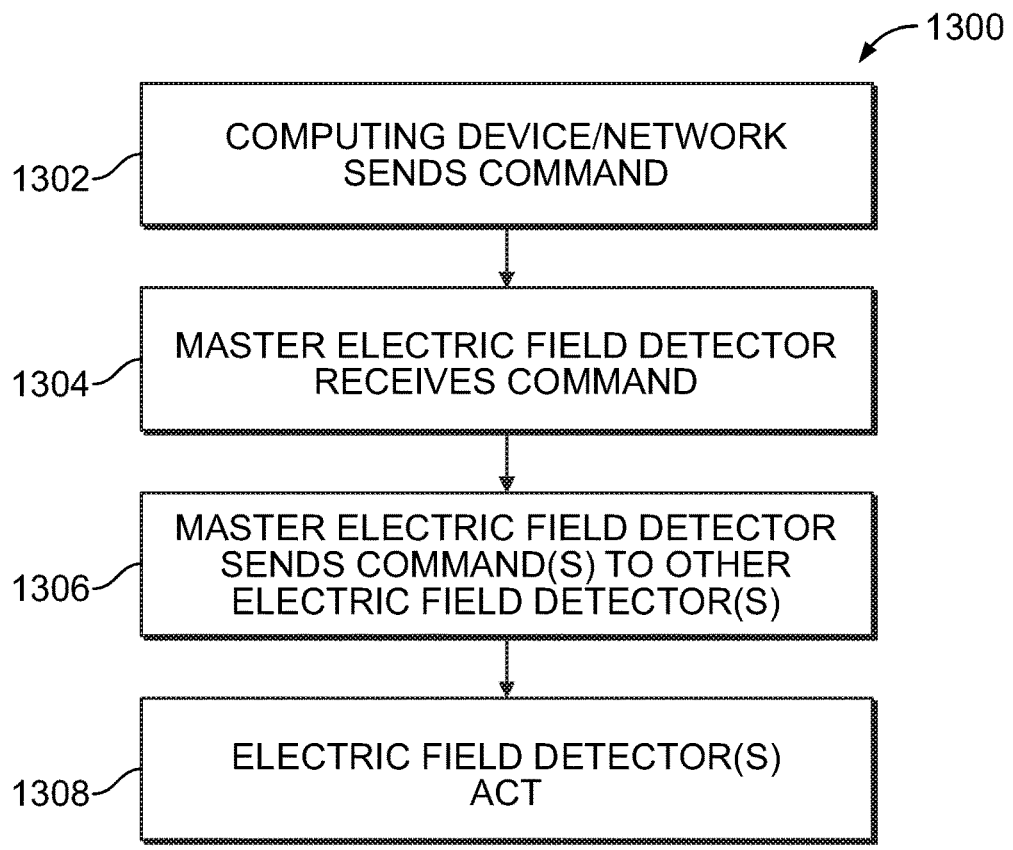
FIG. 36 is a flowchart of an example logic of control of the system shown in FIG. 35.

FIG. 36 is a flowchart of an example logic 1300 of control by the computing device and/or network 184 of the system shown in FIG. 35. The computing device and/or network 184 sends a control command to the master electric field detector 2020a (1302). The master electric field detector 2020a receives this control command and processes the control command (1304). The master electric field detector 2020a sends control commands to the other electric field detector(s) 120b-n (1306). The electric field detector(s) 2020b-n receive this control command, processes the control command, and then act (1308).

Figure 37:
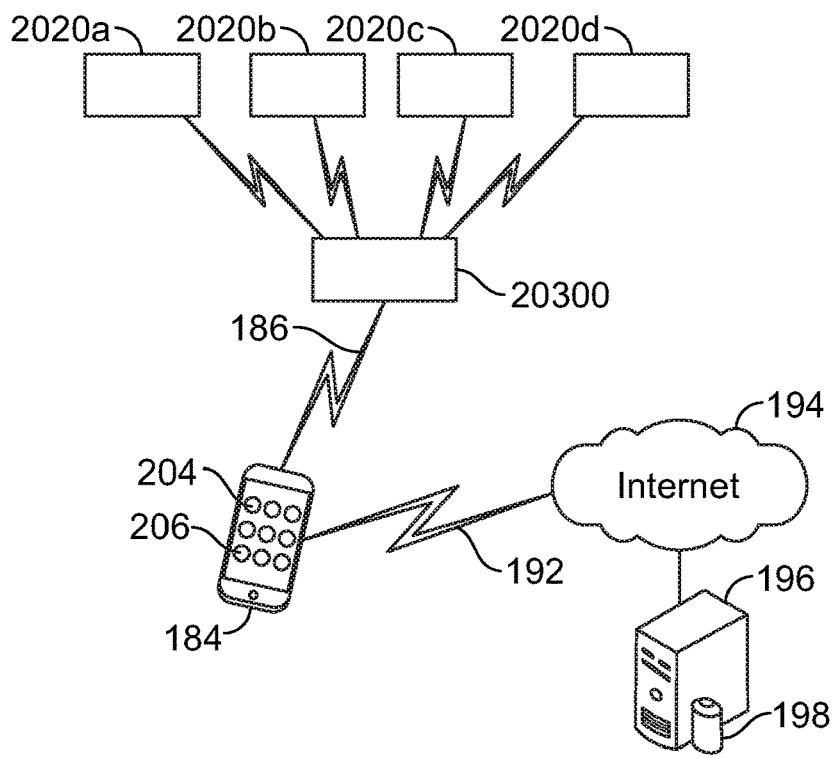
FIG. 37 is another exemplary system in which the electric field detectors and the charging station of FIGS. 23-33 can be used.

With reference to FIG. 37, there is illustrated an exemplary system in which the computing device and/or network 184 is in communication with the control apparatus 20306 of the charging station 20300 and is used to issue commands to control the electric field detectors 2020a-d. In the illustrative example of FIG. 37, an app 204 resident on the computing device and/or network 184 is used to send command signals to the control apparatus 20306 of the charging station 20300. The command signals may be sent from the computing device and/or network 184 by radio frequency ("RF"). While wireless communication, etc., between the computing device and/or network 184 and the control apparatus 20306 of the charging station 20300 is illustrated herein as a direct link, it should be appreciated that in some instances such communication may take place via a local area network or personal area network, and as such may involve various intermediary devices such as routers, bridges, access points, etc. Since these items are not necessary for an understanding of the present disclosure, they are omitted from this and subsequent Figures for the sake of clarity.

In an embodiment, the computing device and/or network 184 and the control apparatus 20306 of the charging station 20300 are in bi-directional communication.

Since smart device remote control apps such as that contemplated in the computing device and/or network 184 are well known, for the sake of brevity the operation, features, and functions thereof will not be described in detail herein.

A setup app 206 executing on the computing device and/or network 184 may be utilized in conjunction with an Internet (192, 194) accessible server 196 and associated database 198 to initially configure the control apparatus 20306 of the charging station 20300 for operation with the electric field detectors 2020a-d which are to be controlled, i.e., to communicate to the control apparatus 20306 of the charging station 20300 a matching command code set and capability profile for each particular electric field detectors 2020a-d to be controlled.

Figure 38:
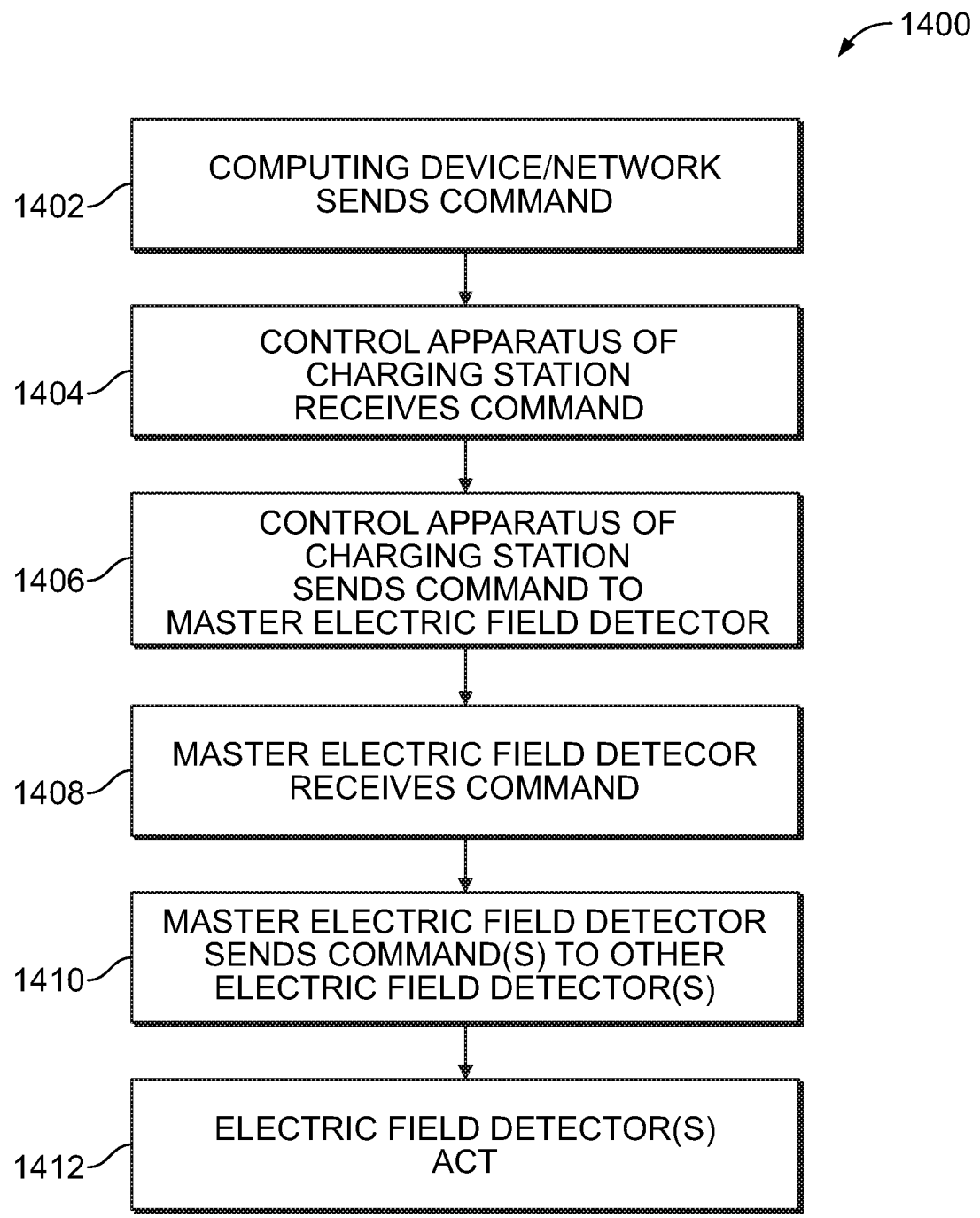
FIG. 38 is a flowchart of an example logic of control of the system shown in FIG. 37.

FIG. 38 is a flowchart of an example logic 1400 of control by the computing device and/or network 184 of the system shown in FIG. 37. The computing device and/or network 184 sends a control command to the control apparatus 20306 of the charging station 20300 (1402). The control apparatus 20306 of the charging station 20300 receives this control command and processes the control command (1404). The control apparatus 20306 of the charging station 20300 sends control command(s) to the master electric field detector 2020a (1406). The master electric field detector 2020a receives this control command and processes the control command (1408) and then sends control commands to the other electric field detector(s) 2020*b-d* (1410). The electric field detector(s) 2020*b-d* receive this control command, processes the control command, and then act (1412).

Alternatively, the control apparatus 20306 of the charging station 20300 may send control commands directly to each of the electric field detectors 2020*a-d*.

In either embodiment shown in FIGS. 35-38, the commands may be, for example, to turn individual ones, or all of, the electric field detectors 2020*a-d* on or off, to assign voltage thresholds to individual ones, or all of, the electric field detectors 2020*a-d*, or to otherwise control parameters of operation of the electric field detectors 2020*a-d*. While the control apparatus 20306 is descried as being in the charging station 20300, the control apparatus 20306 can be located in a separate apparatus.

While the voltage threshold is described herein as a voltage meeting a certain voltage, the system could be modified to provide a warning if no voltage is detected.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

What is claimed is:

1. A system provided in an environment, comprising:
   a piece of equipment comprising a component configured to come into direct contact with a conductor of electricity or come into proximity of a conductor of electricity, and a control system which is in operative communication with the component and which is configured to control operation of the component;
   a plurality of electric field detectors on the equipment, including at least a first electric field detector and a second electric field detector;
   the first electric field detector operably connected with first field detection circuitry configured to detect a voltage in an electric field in the environment which meets or exceeds a voltage threshold, the first field detection circuitry in communication with the control system of the piece of equipment;
   the second electric field detector operably connected with second field detection circuitry configured to detect a voltage in an electric field in the environment which meets or exceeds a voltage threshold, the second field detection circuitry in communication with the control system of the piece of equipment;
   wherein when an overvoltage is detected by at least one of the plurality of electric field detectors, the control system of the equipment is configured to act by performing one or both of 1) activating a warning module on the equipment and 2) causing the component of the equipment to act;
   a warning module operably connected with the first field detection circuitry and configured to provide a warning to operators based on the voltage meeting or exceeding the voltage threshold, and configured to provide a warning notification to the second electric field detector, wherein the first electric field detector is configured to receive a warning notification from the second electric field detector; and
   wherein when first electric field detector receives the warning notification from the second electric field detector of the plurality of electric field detectors, the warning module of the first electric field detector provides a warning to the operators.

2. The system of claim 1, wherein when the overvoltage is detected by any of the electric field detectors, the control system of the equipment is configured to act by performing one of 1) activating a warning module on the equipment and 2) causing the component of the equipment to act.

3. The system of claim 2, wherein the piece of equipment further comprises a user interface, and wherein when the overvoltage is detected by any of the electric field detectors, the control system of the equipment is configured to act by further activating a warning on the user interface.

4. The system of claim 1, wherein the piece of equipment further comprises a user interface, and wherein when the overvoltage is detected by any of the electric field detectors, the control system of the equipment is configured to act by further activating a warning on the user interface.

5. The system of claim 1, wherein the electric field detectors are in operative communication with each other and with the control system.

6. The system of claim 1, wherein when one of the plurality of the electric field detectors detect an overvoltage, the electric field detector that detects the overvoltage is configured to send a warning notification to the control system.

7. The system of claim 1, wherein when one of the plurality of the electric field detectors detects an overvoltage, the electric field detector that detects the overvoltage is configured to send a warning notification to at least another of the electric field detectors.

8. The system of claim 1, wherein the electric field detectors and the control system are wirelessly connected to each other.

9. The system of claim 1, wherein the electric field detectors and the control system are connected to each other via a wired connection.

10. The system of claim 1, wherein when the control system of the equipment is configured to act by causing the component of the equipment to act to stop operation of the equipment.

11. The system of claim 1, further comprising a computing device or network in communication with the electric field detectors and configured to control parameters of the electric field detectors.

12. The system of claim 1, wherein each electric field detector includes field detection circuitry and, includes a warning module in communication with the corresponding field detection circuitry, wherein the respective field detection circuitry is configured to activate the corresponding warning module when an overvoltage is detected by the corresponding field detection circuitry.

13. The system of claim 1, wherein the component includes a motor.

14. The system of claim 1, wherein the equipment further comprises wheels.

15. The system of claim 1, wherein the equipment is mounted on the ground.

16. The system of claim 15, wherein at least one electric field detector is positioned between the equipment and the ground.

* * * * *